United States Patent
Mori et al.

(10) Patent No.: US 7,636,027 B2
(45) Date of Patent: Dec. 22, 2009

(54) PIEZOELECTRIC RESONATOR AND PIEZOELECTRIC THIN-FILM FILTER

(75) Inventors: Yuka Mori, Takatsuki (JP); Hideki Kawamura, Tokyo-to (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 146 days.

(21) Appl. No.: 11/871,285

(22) Filed: Oct. 12, 2007

(65) Prior Publication Data

US 2008/0174389 A1    Jul. 24, 2008

Related U.S. Application Data

(63) Continuation of application No. PCT/JP2006/310308, filed on May 24, 2006.

(30) Foreign Application Priority Data

Jun. 2, 2005    (JP)    ............... 2005-163064

(51) Int. Cl.
*H03H 9/15* (2006.01)
*H03H 9/54* (2006.01)

(52) U.S. Cl. ............ 333/189; 333/167; 310/334; 310/367

(58) Field of Classification Search ......... 333/187, 333/189; 310/334, 367
See application file for complete search history.

(56) References Cited

U.S. PATENT DOCUMENTS

| | | | | |
|---|---|---|---|---|
| 5,903,087 A * | 5/1999 | Mattson et al. | ............ | 310/365 |
| 6,150,703 A * | 11/2000 | Cushman et al. | ............ | 257/415 |
| 6,215,375 B1 * | 4/2001 | Larson et al. | ............ | 333/187 |
| 6,307,447 B1 * | 10/2001 | Barber et al. | ............ | 333/189 |
| 6,339,276 B1 * | 1/2002 | Barber et al. | ............ | 310/312 |
| 6,812,619 B1 * | 11/2004 | Kaitila et al. | ............ | 310/320 |
| 6,943,648 B2 * | 9/2005 | Maiz et al. | ............ | 333/188 |
| 6,954,121 B2 * | 10/2005 | Bradley et al. | ............ | 333/187 |
| 6,975,184 B2 * | 12/2005 | Wang et al. | ............ | 333/188 |
| 7,161,448 B2 * | 1/2007 | Feng et al. | ............ | 333/187 |
| 7,173,361 B2 * | 2/2007 | Saito et al. | ............ | 310/320 |
| 7,230,367 B2 * | 6/2007 | Yamaguchi et al. | ............ | 310/324 |

(Continued)

FOREIGN PATENT DOCUMENTS

DE    102 41 425    3/2004

(Continued)

OTHER PUBLICATIONS

Machine translation of Nishimura et al. JP 2002-374144 published Dec. 26, 2002.*

(Continued)

*Primary Examiner*—Barbara Summons
(74) *Attorney, Agent, or Firm*—Dickstein Shapiro LLP

(57) ABSTRACT

A piezoelectric resonator and a piezoelectric thin-film filter including the piezoelectric resonator. The piezoelectric resonator includes a piezoelectric layer disposed between a pair of conductive layers to form a vibrating region. Outer edges of the vibrating region each have a waveform. The vibrating region includes a peripheral portion extending along the outer edges of the planar shape and having a relatively small thickness; and a central portion extending inside the peripheral portion and having a relatively large thickness. The piezoelectric resonator is thus capable of suppressing long-wavelength spurious modes and short-wavelength spurious modes.

18 Claims, 17 Drawing Sheets

U.S. PATENT DOCUMENTS

| | | | |
|---|---|---|---|
| 7,236,066 B2 * | 6/2007 | Ebuchi | 333/187 |
| 7,280,007 B2 * | 10/2007 | Feng et al. | 333/187 |
| 7,388,454 B2 * | 6/2008 | Ruby et al. | 333/187 |
| 2006/0132262 A1 * | 6/2006 | Fazzio et al. | 333/187 |

FOREIGN PATENT DOCUMENTS

| | | | |
|---|---|---|---|
| EP | 1 041 717 | | 10/2000 |
| EP | 1 156 584 | | 11/2001 |
| JP | 2000-332568 | | 11/2000 |
| JP | 2001-211052 | * | 8/2001 |
| JP | 2002-374144 | * | 12/2002 |
| JP | 2003-17974 | | 1/2003 |
| JP | 2003-158442 | | 5/2003 |
| JP | 2003-273693 | | 9/2003 |
| JP | 2005-159402 | | 6/2005 |
| WO | WO-98/56049 | | 12/1998 |
| WO | WO-01/06647 | | 1/2001 |

OTHER PUBLICATIONS

PCT/JP2006/310308 Written Opinion dated Aug. 29, 2006.

PCT/JP2006/310308 International Search Report dated Aug. 29 2006.

* cited by examiner (a)

(b)

(a)

(b)

US 7,636,027 B2

PIEZOELECTRIC RESONATOR AND PIEZOELECTRIC THIN-FILM FILTER

CROSS REFERENCE TO RELATED APPLICATIONS

The present application is a continuation of International Application No. PCT/JP2006/310308, filed May 24, 2006, which claims priority to Japanese Patent Application No. JP2005-163064, filed Jun. 2, 2005, the entire contents of each of these applications being incorporated herein by reference in their entirety.

FIELD OF THE INVENTION

The present invention relates to piezoelectric resonators and piezoelectric thin-film filters. Specifically, the present invention relates to a piezoelectric resonator in which a vibrating region including a pair of conductive layers with a piezoelectric layer provided therebetween is supported so as to be acoustically isolated from a substrate and a piezoelectric thin-film filter including the piezoelectric resonator.

BACKGROUND OF THE INVENTION

In piezoelectric resonators in which piezoelectric resonator elements each including a pair of electrode films with a piezoelectric film are supported on substrates so as to be acoustically isolated from the substrates and operating in a thickness-extensional vibration mode, a transverse vibration mode generates waves that propagate in a planar direction when piezoelectric resonator elements vibrate in the thickness direction, causing the generation of a spurious wave.

To suppress such a spurious wave, for example, as shown in FIGS. 1 and 2, a piezoelectric resonator is reported to have a free-form vibrating region and a bump along the periphery of the vibrating region. That is, a bottom electrode 110 and a piezoelectric layer 100 are each disposed on a SiO$_2$ support layer 200 serving as a substrate and each extend across the full width of the resonator. Boundary regions 2 and 4 and a central portion 3 of a resonator structure 1000 are covered with a top electrode 120. The boundary regions 2 and 4 of the resonator structure 1000 are formed by increasing the thickness of the top electrode layer 120 on the periphery of the electrically excitable vibrating region. The central portion 3 of a resonator 1200 has a free form. Arrows in FIG. 2 indicate scale. The scale in the horizontal direction differs from that in the vertical direction.

In the case where the bump is formed between the free-form central portion 3 and the boundary regions 2 and 4, a long-wavelength spurious Lamb wave and a short-wavelength spurious Lamb wave are simultaneously suppressed. That is, the bump is formed in such a manner that the thickness of the periphery of the vibrating region is larger than the thickness of the central portion, thereby suppressing the long-wavelength wave. The planar shape of the vibrating region is a free form. This suppresses the short-wavelength wave.

The reason for the edge (boundary regions) of the vibrating region having a thickness larger than that of the central region is that the ZnO exhibiting the dispersion property of type I is used. The type I is one of general forms of the dispersion relation k (ω) depicted in FIG. 3. In FIG. 3, the vertical axis represents the angular frequency ω. The horizontal axis on the right side of the vertical axis represents real values of wave number k. On the left side of the vertical axis, the wave number is imaginary. In type I dispersion, the wave number k is real when the angular frequency ω is above the cut-off angular frequency $\omega_c$ of the plate. In type II dispersion, the wave number k is real when the angular frequency ω is below the cut-off angular frequency $\omega_c$ of the plate (for example, Patent Document 1).

Patent Document 1: PCT Japanese Translation Patent Publication No. 2003-505906

In FIG. 3, only a small-wave-number (long-wavelength) region is calculated. In a structure including a piezoelectric film having the type II dispersion property depicted in FIG. 3, for example, a dispersion curve determined by more detailed calculation is shown in FIG. 4. In FIG. 4, the vertical axis represents the frequency. The horizontal axis represents b/λ obtained by normalizing the thickness b of the piezoelectric film by the wavelength λ of the wave propagating in a planar direction. That is, FIG. 4 shows the dispersion curve of the real wave number part. Reference numeral 6a represents the case of a wavelength that is about five times the thickness of the piezoelectric film. Reference numeral 6b represents the case of a wavelength that is about twice the thickness of the piezoelectric film. Reference numeral 8 represents a resonant frequency. The graph demonstrates that long-wavelength Lamb waves 7a and short-wavelength Lamb waves 7b are both present at frequencies near the resonant frequency.

A reduction in the thickness of the cross section of a frame-like zone at the edge of the vibrating region eliminates the generation of a long-wavelength spurious mode in a region where the wavelength represented by reference numeral 7a is about five or more times the thickness of the piezoelectric film in FIG. 4. In the case of the dispersion curve as shown in FIG. 4, however, in the vicinity of the resonant frequency 8, a short-wavelength spurious mode is present in a region where the wavelength represented by reference numeral 7b is equal to or less than about twice the thickness of the piezoelectric film in FIG. 4 in addition to the long-wavelength spurious mode.

The short-wavelength spurious mode can be suppressed by forming the planar shape of the resonator into a free form as shown in FIG. 1. However, the resonator having the shape is difficult to arrange and is not suitable for the miniaturization of the piezoelectric resonator. The planar shape of the resonator also affects the layout of a filter and the size of a chip; hence, a substantially rectangular shape is preferred.

The origin of the short-wavelength spurious radiation is insufficiently analyzed. Thus, an optimum planar shape of the vibrating region is not found.

SUMMARY OF THE INVENTION

In consideration of the above-described situation, it is an object of the present invention to provide a piezoelectric resonator capable of suppressing the long-wavelength spurious mode and the short-wavelength spurious mode and provide a piezoelectric thin-film filter including the piezoelectric resonator.

To overcome the foregoing problems, the present invention provides a piezoelectric resonator having a structure described below.

The piezoelectric resonator includes a substrate; a pair of conductive layers disposed on the substrate; and a piezoelectric layer disposed between the pair of conductive layers. At least a region of the piezoelectric layer disposed between the pair of conductive layers (hereinafter, the region being referred to as a "vibrating region") is acoustically isolated from the substrate. In a dispersion curve in which the vertical axis represents the frequency, the horizontal axis on the right side of the vertical axis represents the real wave number, and the horizontal axis on the left side of the vertical axis represents the imaginary wave number, when the frequency is lower than a cut-off angular frequency $\omega_c$, the vibrating region has a real wave number. The shape of the vibrating region when viewed in the thickness direction of the pair of conductive layers and the piezoelectric layer (hereinafter, the shape being referred to as a "planar shape") is a substantial polygon, sides of the substantial polygon are not parallel to each other. The vibrating region includes a peripheral portion extending along outer edges of the planar shape and having a relatively small thickness; and a central portion extending inside the peripheral portion and having a relatively large thickness.

In the above-described structure, the vibrating region is acoustically isolated by a gap or a sound reflecting layer provided between the vibrating region and the substrate or by an opening formed in the substrate.

According to the above-described structure, the planar shape of the vibrating region is a polygon in which sides thereof are not parallel to each other. Every time a wave generated in the vibrating region is reflected from the outer edges of the vibrating region, the direction of propagation is different. Thus, the reflected waves cancel each other out by scattering as a whole, thereby eliminating the generation of an undesired component due to interference. This suppresses waves having relatively short wavelengths to improve spurious characteristics in a resonant frequency or less.

The peripheral portion of the vibrating region has a thickness smaller than that of the central portion; hence, a step is present. The step suppresses waves having relatively long wavelength to improve spurious characteristics between the resonant frequency and an anti-resonant frequency.

Furthermore, to overcome the above-described problems, the present invention provides a piezoelectric resonator having a structure described below.

A piezoelectric resonator includes a substrate; a pair of conductive layers; and a piezoelectric layer disposed between the pair of conductive layers. At least a region of the piezoelectric layer disposed between the pair of conductive layers (hereinafter, the region being referred to as a "vibrating region") is acoustically isolated from the substrate. In a dispersion curve in which the vertical axis represents the frequency, the horizontal axis on the right side of the vertical axis represents the real wave number, and the horizontal axis on the left side of the vertical axis represents the imaginary wave number, when the frequency is lower than a cut-off angular frequency $\omega_c$, the vibrating region has a real wave number. The shape of the vibrating region when viewed in the thickness direction of the pair of conductive layers and the piezoelectric layer (hereinafter, the shape being referred to as a "planar shape") is a substantial rectangle, sides of the substantial rectangle each have a waveform in which a curved or angular wave segment is repeated. The vibrating region includes a peripheral portion extending along outer edges of the planar shape and having a relatively small thickness; and a central portion extending inside the peripheral portion and having a relatively large thickness.

In the above-described structure, the vibrating region is acoustically isolated by a gap or a sound reflecting layer provided between the vibrating region and the substrate or by an opening formed in the substrate.

According to the above-described structure, outer edges of the planar shape of the vibrating region each have a waveform. A wave generated in the vibrating region is reflected in various directions. Thus, the reflected waves cancel each other out by scattering as a whole, thereby eliminating the generation of an undesired component due to interference. This suppresses waves having relatively short wavelengths to improve spurious characteristics between a resonant frequency and an anti-resonant frequency.

The peripheral portion of the vibrating region has a thickness smaller than that of the central portion; hence, a step is present. The step suppresses waves having relatively long wavelength to improve spurious characteristics in a resonant frequency or less.

Furthermore, the planar shape of the vibrating region is a substantially rectangle, thereby facilitating layout and reducing the size of the piezoelectric resonator.

Preferably, the piezoelectric resonator having any one of the above-described structure further includes a dielectric layer extending along at least one conductive layer of the pair of conductive layers, the dielectric layer being disposed on a side of the at least one conductive layer opposite the side adjacent to the piezoelectric layer. The dielectric layer is arranged so as to be superposed at least on the vibrating region when viewed in the thickness direction of the pair of conductive layers and the piezoelectric layer.

In the above-described structure, the dielectric layer arranged so as to be superposed at least on the vibrating region when viewed in the thickness direction of the pair of conductive layers and the piezoelectric layer vibrates together with the piezoelectric layer and the pair of conductive layers of the vibrating region.

According to the above-described structure, the presence of the dielectric layer facilitates control of the frequency of the piezoelectric resonator.

Preferably, the planar shape of the vibrating region suppresses a spurious Lamb wave having a relatively short wavelength that is equal to or less than twice the thickness of the piezoelectric layer, and the thicknesses of the peripheral portion and the central portion suppress a spurious Lamb wave having a relatively long wavelength that is five or more times the thickness of the piezoelectric layer.

According to the above-described structure, the spurious waves are suppressed by different methods in response to the wavelength, thereby improving total characteristics.

Specifically, various structures can be used as follows.

Preferably, each of the outer edges of the vibrating region with a substantially rectangular planar shape has a) at least one waveform selected from a triangular wave, a rectangular wave, a sinusoidal wave, and an irregular wave or has b) a waveform obtained by combining two or more waves selected from a triangular wave, a rectangular wave, a sinusoidal wave, and an irregular wave.

According to the above-described structure, the outer edges each having the waveform provides spurious-mode-suppressed resonance characteristics.

Preferably, the vibrating region has a substantially rectangular planar shape. Each of the outer edges of the planar shape has a waveform in which a single wave segment having a length of 0.5 to 12.5 times the thickness of the piezoelectric layer is repeated.

According to the above-described structure, the outer edges each having the waveform provides short-wavelength-spurious-mode resonance characteristics. The planar shape is a rectangle, thereby facilitating layout and reducing the size of the piezoelectric resonator.

Preferably, the vibrating region has a substantially rectangular planar shape. Each of the outer edges of the planar shape has a waveform in which a single wave segment having a total amplitude of 0.5 to 6.25 times the thickness of the piezoelectric layer is repeated.

According to the above-described structure, the outer edges each having the waveform provides short-wavelengthspurious-mode resonance characteristics. The planar shape is a rectangle, thereby facilitating layout and reducing the size of the piezoelectric resonator.

Preferably, at least one of the pair of conductive layers has a relatively small thickness at a portion included in the peripheral portion of the vibrating region and has a relatively large thickness at a portion included in the central portion of the vibrating region.

According to the above-described structure, the central portion of the vibrating region has a thickness larger than that of the peripheral portion of the vibrating region by the formation of a step of the conductive layer. This suppresses long-wavelength spurious modes.

Preferably, the piezoelectric layer has a relatively small thickness at a portion included in the peripheral portion of the vibrating region and has a relatively large thickness at a portion included in the central portion of the vibrating region.

According to the above-described structure, the central portion of the vibrating region has a thickness larger than that of the peripheral portion of the vibrating region by the formation of a step of the piezoelectric layer. This suppresses long-wavelength spurious modes.

Preferably, the dielectric layer has a relatively small thickness at a portion included in the peripheral portion of the vibrating region and has a relatively large thickness at a portion included in the central portion of the vibrating region.

According to the above-described structure, the central portion of the vibrating region has a thickness larger than that of the peripheral portion of the vibrating region by the formation of a step of the dielectric layer. This suppresses long-wavelength spurious modes.

Preferably, the peripheral portion of the vibrating region has a tapered profile with a gradual change in thickness in the vicinity of the boundary between the peripheral portion and the central portion of the vibrating region.

According to the above-described structure, the step of the vibrating region is easily formed by etching or the like.

Preferably, the vibrating region has a step profile having a sharp change in thickness at the boundary between the peripheral portion and the central portion of the vibrating region.

According to the above-described structure, the width of the step formed in the vibrating region is accurately controlled.

Preferably, the width of the peripheral portion of the vibrating region is 3 to 9 times the thickness of the piezoelectric layer.

The above-described structure provides long-wavelength-spurious-mode-suppressed resonance characteristics.

Preferably, at least one conductive layer of the pair of conductive layers includes at least two sublayers stacked. one sublayer of the at least two sublayers is located adjacent to the piezoelectric layer, and the other sublayer of the at least two sublayers is located remote from the piezoelectric layer and is arranged inside and apart from an end of the one sublayer in the vibrating region.

According to the above-described structure, a step that suppresses long-wavelength spurious modes is easily formed.

Preferably, at least one of the pair of conductive layers includes at least two sublayers stacked, the at least two sublayers having different etching resistances. One sublayer of the at least two sublayers, the one sublayer being located adjacent to the piezoelectric layer, has a relatively high etching resistance. The other sublayer of the at least two sublayers, the other sublayer being located remote from the piezoelectric layer, has a relatively low etching resistance. The other sublayer is arranged inside and apart from an end of the one sublayer by etching an end portion of the other sublayer until the one sublayer is exposed.

According to the above-described structure, a step that suppresses long-wavelength spurious modes is easily formed.

Preferably, the one sublayer having a relatively high etching resistance contains at least one metal selected from the group consisting of Pt, W, Mo, Ir, Os, Re, and Ru. The other sublayer having a relatively low etching resistance contains at least one metal selected from the group consisting of Al, Ti, Au, NiCr, Cr, and Cu.

According to the above-described structure, a step that suppresses long-wavelength spurious modes is easily formed.

Preferably, the piezoelectric material constituting the piezoelectric layer is AlN or ZnO.

The above-described structure provides long-wavelength-spurious-mode-suppressed resonance characteristics.

Preferably, the dielectric layer is composed of at least one dielectric material selected from the group consisting of $SiO_2$, AlN, and SiN.

The above-described structure provides long-wavelength-spurious-mode-suppressed resonance characteristics.

Furthermore, to overcome the above-described problems, the present invention provides a piezoelectric thin-film filter having a structure described below.

The piezoelectric thin-film filter includes a plurality of piezoelectric resonators. Only some of the plurality of piezoelectric resonators are the piezoelectric resonators having any of the above-described structures.

The above-described structure provides satisfactory ripple-suppressed filter characteristics while the pass band width of the filter is ensured.

Furthermore, to overcome the above-described problems, the present invention provides a piezoelectric thin-film filter having a structure described below.

The piezoelectric thin-film filter includes a plurality of piezoelectric resonators connected in the form of a ladder. One or more of the piezoelectric resonators are connected in series, and at least one of the series-connected piezoelectric resonators is the piezoelectric resonator having any of the structures described above.

The above-described structure provides satisfactory ripple-suppressed filter characteristics while the pass band width of the filter is ensured.

Furthermore, to overcome the above-described problems, the present invention also provides a piezoelectric thin-film filter having a structure described below.

The piezoelectric thin-film filter includes a plurality of piezoelectric resonators connected in the form of a ladder. At least one relatively-high-frequency piezoelectric resonator of the plurality of piezoelectric resonators is the piezoelectric resonator having any of the structures described above.

The above-described structure provides satisfactory ripple-suppressed filter characteristics while the pass band width of the filter is ensured.

The piezoelectric resonator and the piezoelectric thin-film filter of the present invention can suppress long-wavelength spurious modes and short-wavelength spurious modes.

Figure 1:
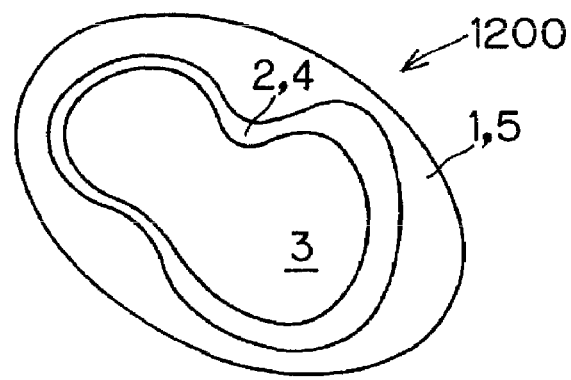
FIG. 1 is a plan view of a piezoelectric resonator (known art).
Figure 2:
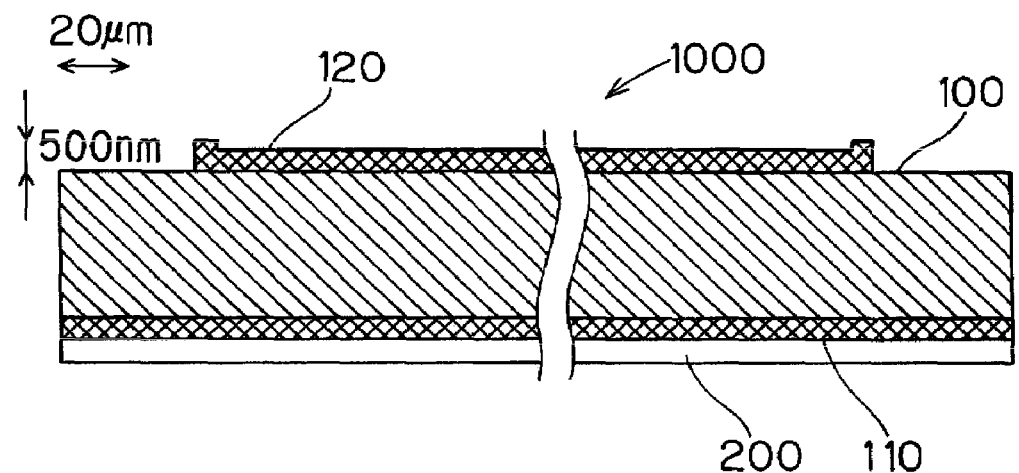
FIG. 2 is a cross-sectional view of the piezoelectric resonator (known art).
Figure 3:
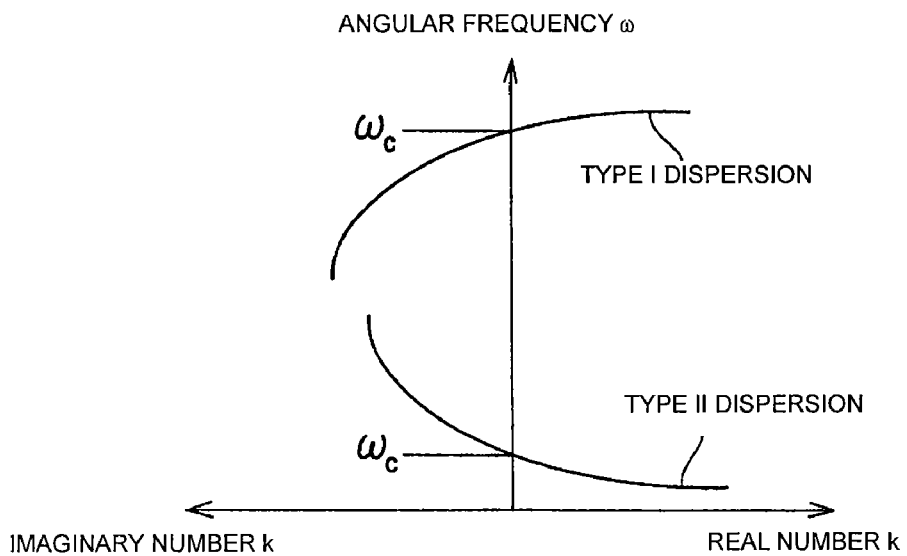
FIG. 3 is a graph showing general dispersion curves.

REFERENCE NUMERALS 10, 20, 30, 40, 50 piezoelectric resonator
12, 22, 32, 42, 52 substrate
13, 23, 33, 43, 53 gap
14, 24, 34, 44, 54 bottom electrode (conductive layer)
15, 25, 35, 45, 55 piezoelectric layer
16, 26, 36, 46, 56 top electrode (conductive layer)
17, 27, 37 dielectric layer
18, 18x, 18y, 28, 38, 48, 58 vibrating region
18a, 18b, 18c outer edge
18s, 18s', 18s'', 28s, 38s, 48s, 58s central portion
18t, 18t', 18t'', 18t''', 28t, 38t, 48t, 58t peripheral portion
72 lattice filter
76 ladder filter

DETAILED DESCRIPTION OF THE INVENTION

Embodiments of the present invention will be described below with reference to FIGS. 5(a) to 27.

With respect to a piezoelectric resonator including at least two conductive layers and at least one piezoelectric layer disposed between the conductive layers and a piezoelectric thin-film filter configured by a combination of the piezoelectric resonators, embodiments of the present invention have advantages (1) to (4) as follows:

(1) A reduction in thickness of edges of a vibrating region suppresses long-wavelength spurious modes.

(2) "A rectangle with edges each having a triangular waveform", "a rectangle with edges each having a rectangular waveform", or "a rectangle with sides that are not parallel to each other", which facilitates layout and suppresses short-wavelength-spurious modes, is used as a planar shape of the vibrating region.

(3) The resonator formed by employing techniques described in Items (1) and (2) is used as a relatively-high-frequency resonator of resonators constituting a lattice filter, thereby suppressing ripples in the pass band width of the filter (even when a series resonator and a parallel resonator are interchanged in a lattice filter, the same characteristics are obtained).

(4) The resonator formed by employing techniques described in Items (1) and (2) is used as a series resonator of resonators constituting a ladder filter, thereby suppressing ripples in the pass band width of the filter.

That is, as described in Item (2), the edges having the waveform of the rectangular vibrating region scatter a wave having a wavelength comparable to the waveform at the edges to cancel a spurious wave (short-wavelength spurious wave) out. An increase in the scale of the waveform cancels a long-wavelength wave out. However, with respect to a method for canceling a long-wavelength wave, the formation of steps at the edges of the vibrating region as described in Item (1) provides more satisfactory characteristics, facilitates layout, and reduces the size of the resonator.

However, a resonator having steps at edges of a vibrating region and having a waveform at the edges of the vibrating region was actually formed by the techniques described in Items (1) and (2). As shown in Smith charts in FIGS. 5(a) and 5(b), it was found that characteristics at a resonant frequency or less were improved but that characteristics at the resonant frequency or more were degraded. In FIGS. 5(a) and 5(b), Symbol s represents the case where the steps are formed at the edges of the rectangular vibrating region having sides that are not parallel to each other. Symbol t represents the case where no step is formed at the edges of the rectangular vibrating region having sides that are not parallel to each other. FIG. 5(b) is an enlarged view of a portion indicated by Symbol A in FIG. 5(a).

As shown in FIG. 6(a), resonators 80a to 80d may be connected in the form of a lattice to form a filter. Alternatively, as shown in FIG. 6(b), resonators 83 and 84 may be connected in the form of a ladder to form a filter.

Figure 7:
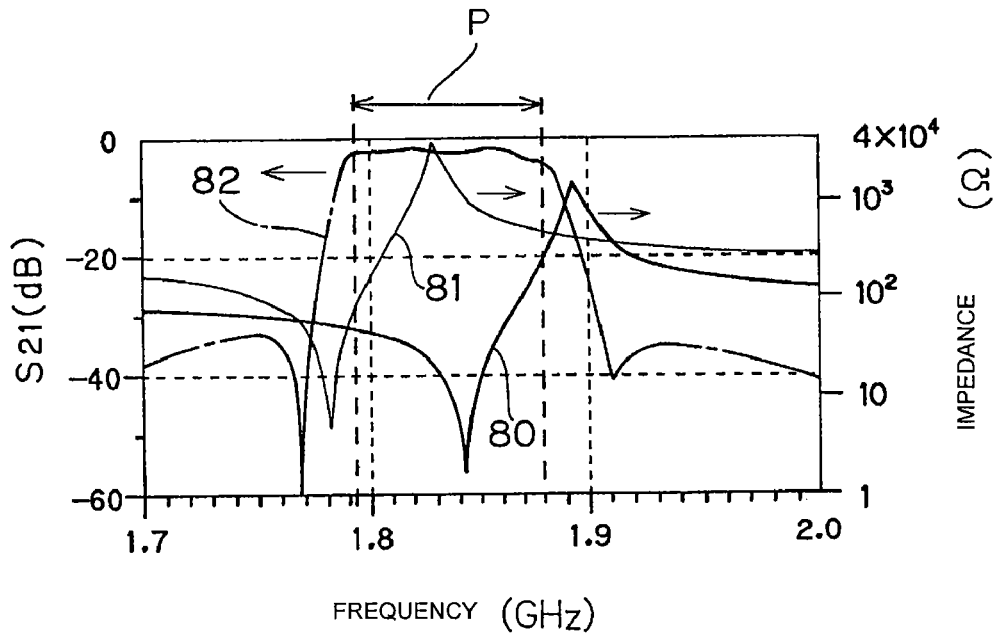
FIG. 7 is a graph showing characteristics of a lattice filter.

FIG. 7 shows the relationship of characteristics of a resonator and a lattice filter formed by combining resonators (series resonator and parallel resonator) having different frequencies. A resonator having a relatively high frequency is used as the series resonator. In FIG. 7, reference numeral 80 represents the impedance of the series resonator. Reference numeral 81 represents the impedance of the parallel resonator. Reference numeral 82 represents filter characteristics.

With respect to the filter characteristics, it is necessary to ensure a filter bandwidth while suppressing ripples in pass band width P. The characteristics in the pass band width P of the filter are affected by characteristics of the series resonator at and near the resonant frequency and the parallel resonator at and near the anti-resonant frequency. In the case where resonators according to the technique described in Item (2) are used for both of the series resonator and parallel resonator constituting the filter, the parallel resonator impairs the characteristics in the pass band width of the filter.

Figure 8:
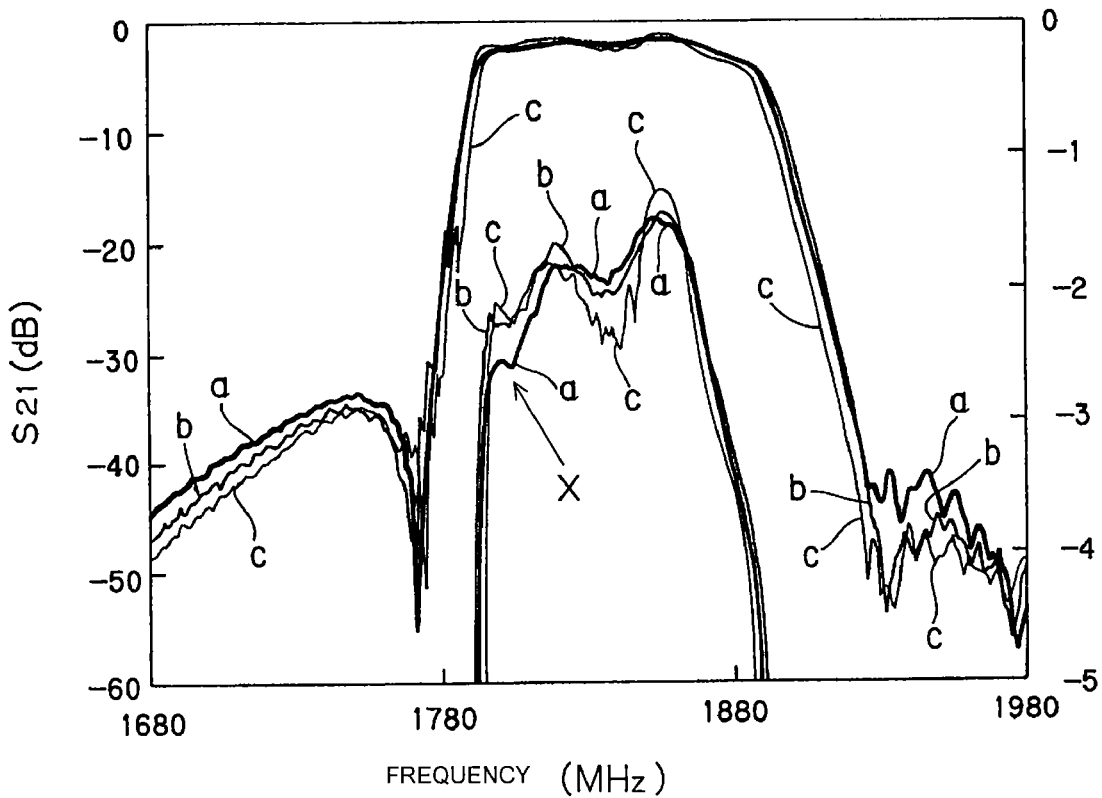
FIG. 8 is a graph showing characteristics of a lattice filter.

Referring to FIG. 8, Symbol a represents filter characteristics when the technique described in Item (2) is employed for both of the series resonator and parallel resonator. Symbol b represents filter characteristics when the technique described in Item (2) is employed for only the series resonator. Symbol c represents filter characteristics when the technique described in Item (2) is not employed for any of the series resonator and parallel resonator.

In the case where the technique described in Item (2) is not employed for any of the series resonator and parallel resonator (Symbol c), a spurious wave having a frequency equal to or less than the resonant frequency of the series resonator causes the generation of ripples in the middle of the pass band width of the filter. In the case where the technique described in Item (2) is employed for both of the series resonator and parallel resonator (Symbol a), the characteristics of the parallel resonator are degraded at a frequency equal to or higher than the resonant frequency. Thus, as shown at Arrow X, the characteristics around the left shoulder in the pass band width of the filter are degraded; hence, the filter bandwidth is not ensured. In the case where the technique described in Item (2) is employed for only the series resonator (Symbol b), it is possible to suppress the ripples in the middle of the pass band width of the filter while ensuring the filter band width.

A first to fourteenth embodiments will be described below with reference to FIGS. 9(a) to 27.

FIRST EMBODIMENT

Figure 9:
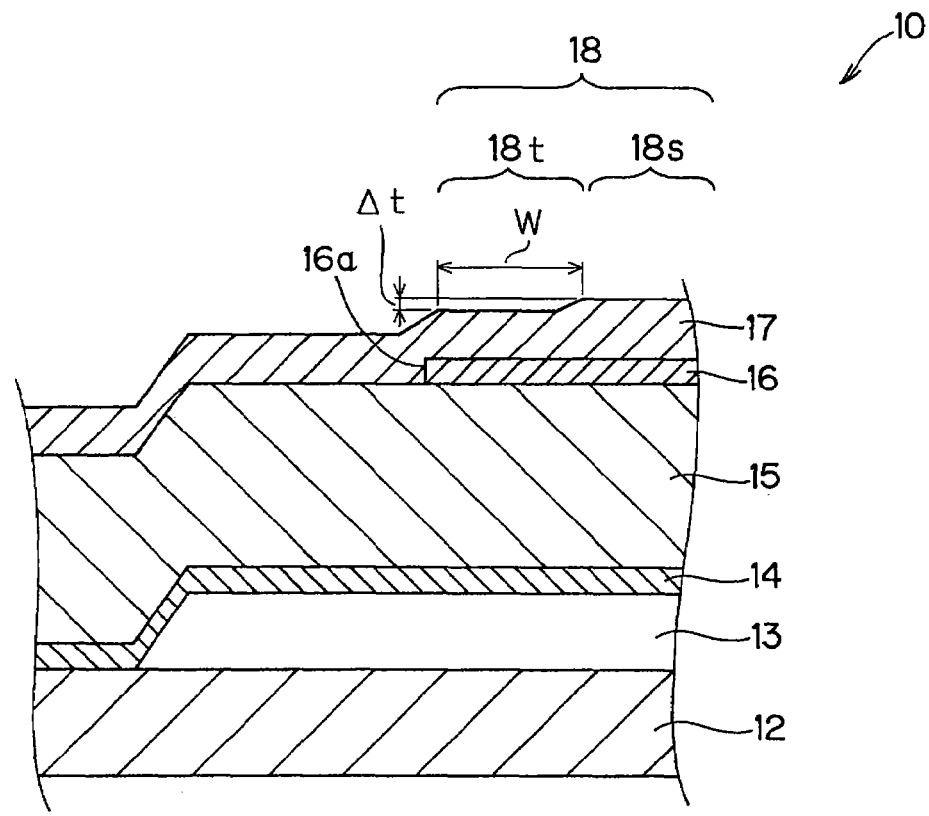
FIG. 9(a) is a fragmentary cross-sectional view of a piezoelectric resonator.
FIG. 9(b) is a fragmentary plan view of a piezoelectric resonator (Example 1).
Figure 9:
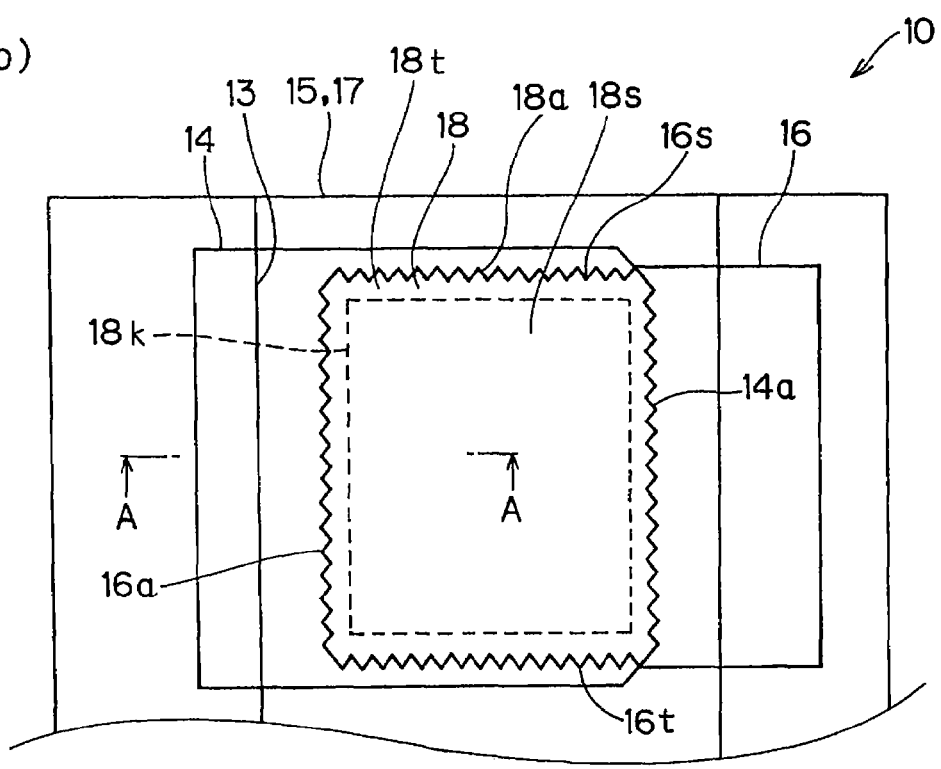
Figure 10:
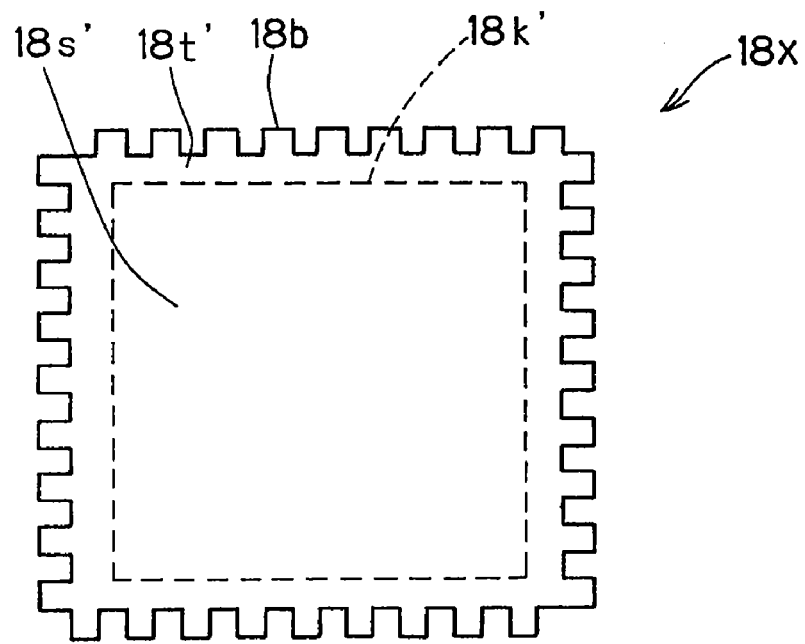
FIG. 10 is a fragmentary plan view of a piezoelectric resonator (Example 1).

A piezoelectric resonator 10 according to a first embodiment will be described below with reference to FIGS. 9(a) to 10. FIG. 9(a) is a fragmentary cross-sectional view taken along line A-A in FIG. 9(b). FIG. 9(b) is a fragmentary plan view.

As shown in FIGS. 9(a) and 9(b), the piezoelectric resonator 10 includes a bottom electrode 14, a piezoelectric layer 15, a top electrode 16, and a dielectric film 17 stacked in that order on a substrate 12. The bottom electrode 14 has a portion supported by the substrate 12 and a floating portion remote from the substrate 12 with a gap 13. A vibrating region 18 in which the piezoelectric layer 15 is disposed between the bottom electrode 14 and the top electrode 16 is arranged on the floating portion. The vibrating region 18 is a portion in which the bottom electrode 14 and the top electrode 16 overlap one another when viewed in the thickness direction (the direction perpendicular to the paper plane in FIG. 9(b)). The vibrating region 18 is acoustically isolated from the substrate 12 via the gap 13. Instead of the gap 13, a sound reflecting layer may be disposed between the substrate 12 and the vibrating region 18 to acoustically isolate the vibrating region 18 from the substrate 12.

The vibrating region 18 includes a peripheral portion 18t extending along outer edges 18a of the vibrating region 18; and a central portion 18s extending inside the peripheral portion 18t, when viewed in the thickness direction. In FIG. 9(b), the boundary 18k between the peripheral portion 18t and the central portion 18s of the vibrating region 18 is represented by a broken line.

As shown in FIG. 9(b), the shape of the outer edges 18a of the vibrating region 18 is a substantial rectangle when viewed in the thickness direction. Sides of the substantial rectangle each have a waveform. That is, an end 14a of the bottom electrode 14, an end 16a of the top electrode 16, portions 16s and 16t of both sides adjacent to both ends, which constitute the outer edges 18a of the vibrating region 18, each have a waveform in which a triangular wave segment is repeated.

Outer edges 18a of the vibrating region 18 may have a waveform. For example, a rectangular waveform may be used as in outer edges 18b of a vibrating region 18x shown in FIG. 10 that is a fragmentary plan view. Alternatively, a sinusoidal waveform may be used. The waveform of the outer edges 18a may have an irregular period and irregular amplitude. In FIG. 10, the boundary 18k' between a peripheral portion 18t' and a central portion 18s' of the vibrating region 18x is represented by a broken line.

As shown in FIG. 9(a), the bottom electrode 14, the piezoelectric layer 15, and the top electrode 16 each have a substantially constant thickness. In the dielectric film 17, a portion constituting the central portion 18s of the vibrating region 18 has a thickness larger than that of the remainder. Thus, in the vibrating region 18, the peripheral portion 18t has a thickness smaller than that of the central portion 18s, thereby forming a step in the vibrating region 18. A portion not including the step may be present.

Figure 4:
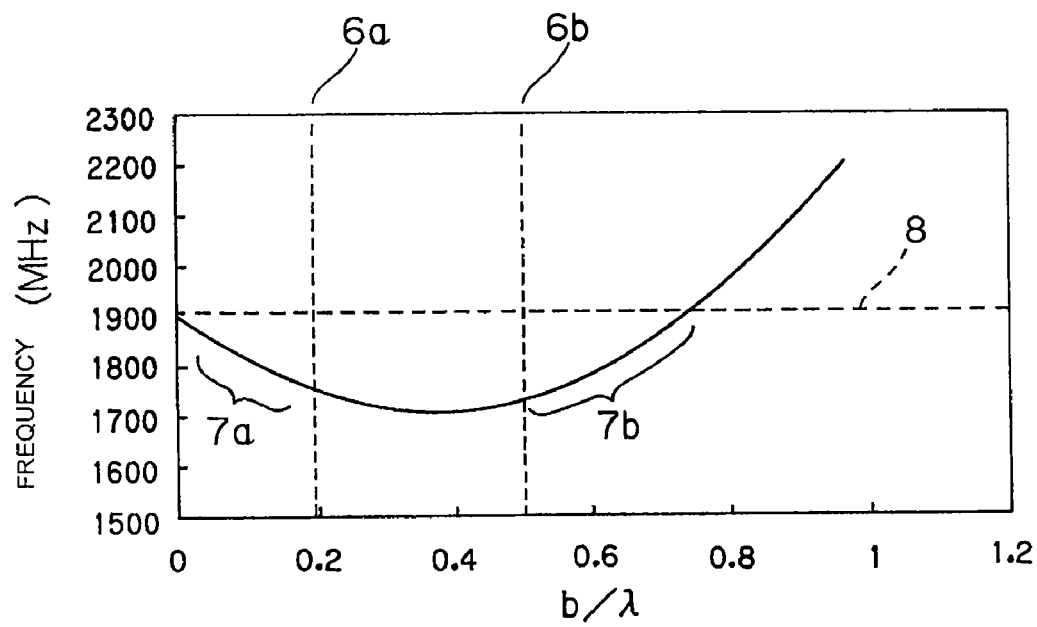
FIG. 4 is a graph showing a type II dispersion curve.
Figure 5:
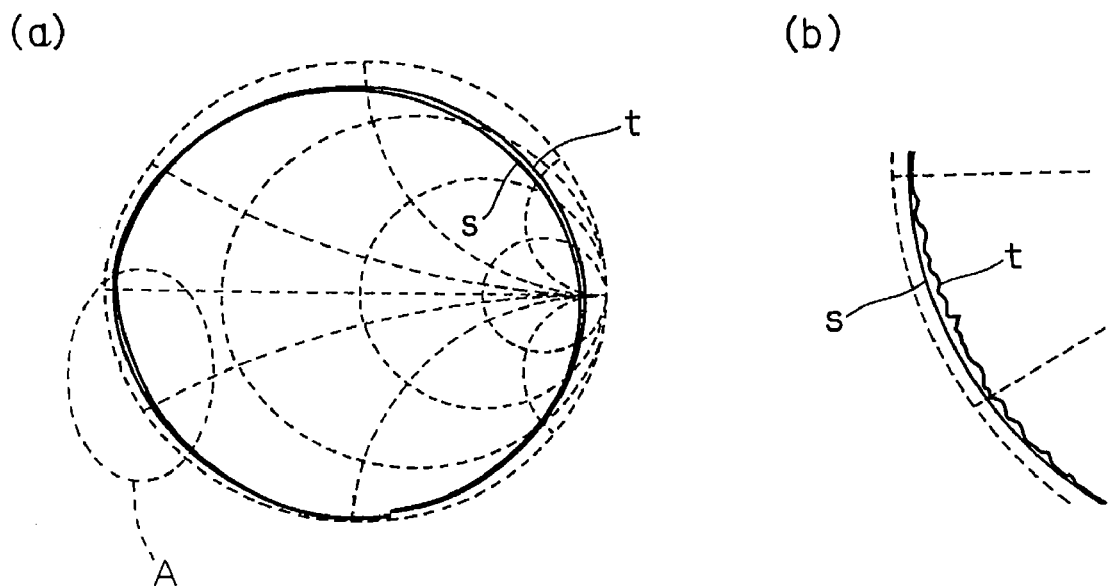
FIGS. 5(a) and 5(b) are each a Smith chart showing resonator characteristics.
Figure 6:
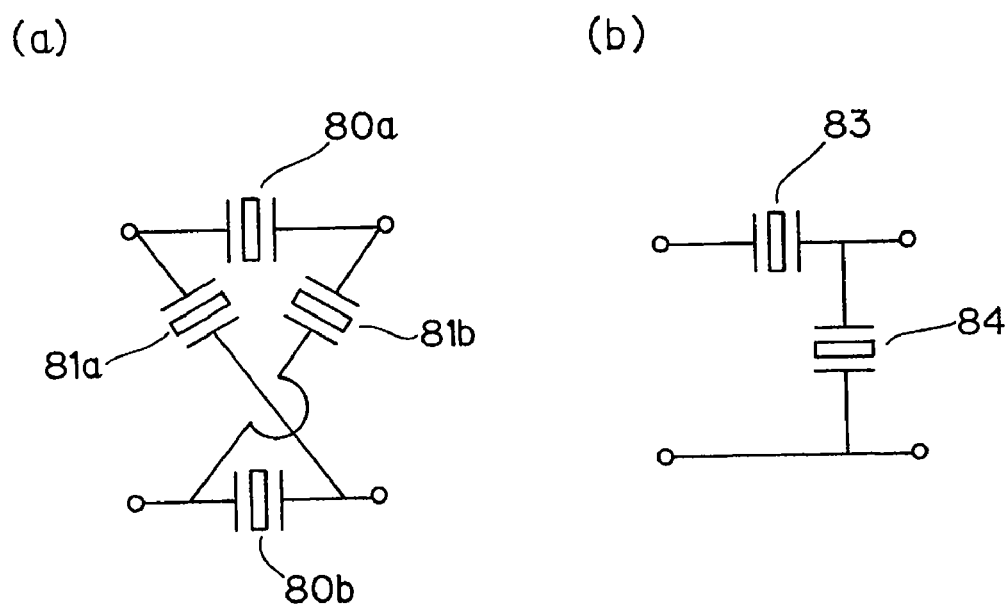
FIG. 6(a) is a block diagram of a lattice filter.
FIG. 6(b) is a block diagram of a ladder filter.

The vibrating region 18 has the type II dispersion property shown in FIG. 4.

Specifically, for example, the dielectric film 17 composed of $SiO_2$ is formed on the piezoelectric layer 15 composed of AlN. The width W of the dielectric film 17 at the peripheral portion 18t of the vibrating region 18 is set at about 10 μm. A change in thickness Δt due to the step is set at about 20 nm.

As shown in FIG. 9(b), the shape of the outer edges 18a of the vibrating region 18 is the substantial rectangle, and each of the sides of the substantial rectangle has the triangular waveform; hence, the piezoelectric resonator 10 can suppress short-wavelength spurious modes. This is probably because among waves reflected from the outer edges 18a of the vibrating region 18, wave components having wavelengths corresponding to the shape of the outer edges 18a cancel each other out, thereby eliminating the generation of an undesired component due to interference.

Alternatively, by changing the thickness of the dielectric film 17 in such a manner that the peripheral portion 18t of the vibrating region 18 has a thickness smaller than that of the central portion 18s, long-wavelength spurious modes can be suppressed.

SECOND EMBODIMENT

A piezoelectric resonator according to a second embodiment will be described with reference to FIG. 11 that is a fragmentary plan view. The piezoelectric actuator according to the second embodiment has substantially the same structure as that of the piezoelectric resonator 10 according to the first embodiment. Hereafter, differences from the first embodiment will be mainly described.

Figure 11:
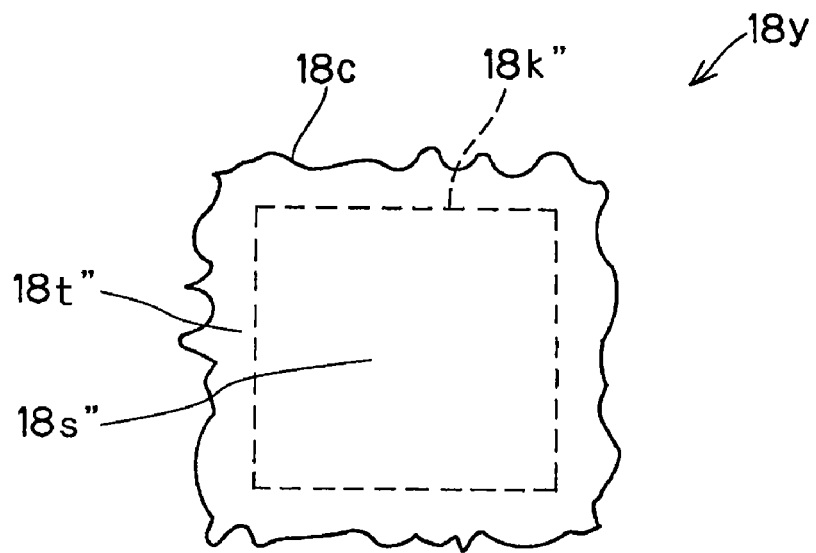
FIG. 11 is a fragmentary plan view of a piezoelectric resonator (Example 2).

As shown in FIG. 11, the shape of outer edges 18c of a vibrating region 18y is a substantial rectangle, and sides of the substantial rectangle each have an irregular waveform. In FIG. 11, the boundary 18k" between a peripheral portion 18t" and a central portion 18s" of the vibrating region 18y is represented by a broken line.

Also in the second embodiment, short-wavelength spurious modes can be suppressed. This is probably because waves reflected from the outer edges 18c cancel each other out by scattering, thereby eliminating the generation of an undesired component due to interference.

In the piezoelectric resonator according to the second embodiment, the peripheral portion 18t" of the vibrating region 18y has a thickness smaller than that of the central portion 18s'', as in the first embodiment, thereby suppressing long-wavelength spurious modes.

THIRD EMBODIMENT

A piezoelectric resonator 20 according to a third embodiment will be described with reference to FIG. 12 that is a fragmentary cross-sectional view.

In the piezoelectric resonator 20, a vibrating region 28 is acoustically isolated from a substrate 22 with a gap 23, as in the first embodiment. Unlike the first embodiment, in a top electrode 26, a portion constituting a central portion 28s of the vibrating region 28 has a thickness larger than that of the remainder. A bottom electrode 24, a piezoelectric layer 25, and a dielectric layer 27 each have a substantially constant thickness. Thus, a peripheral portion 28t of the vibrating region has a thickness smaller than that of the central portion 28s, thereby forming a step in the vibrating region 28.

Specifically, for example, the dielectric layer 27 composed of $SiO_2$ is formed on the piezoelectric layer 25 composed of AlN. The width W of a portion 26a of the top electrode 26, which is the peripheral portion 28t of the vibrating region 28 is set at about 10 μm. A change in thickness $\Delta t$ is set at about 5 nm. The planar shape of the vibrating region 28 is a rectangle. Outer edges of the vibrating region 28 each have a waveform. A drawing is the same as FIG. 9(b) in the first embodiment and is thus omitted.

The piezoelectric resonator 20 can suppress both long-wavelength spurious modes and short-wavelength spurious modes as in the first embodiment.

FOURTH EMBODIMENT

Figure 13:
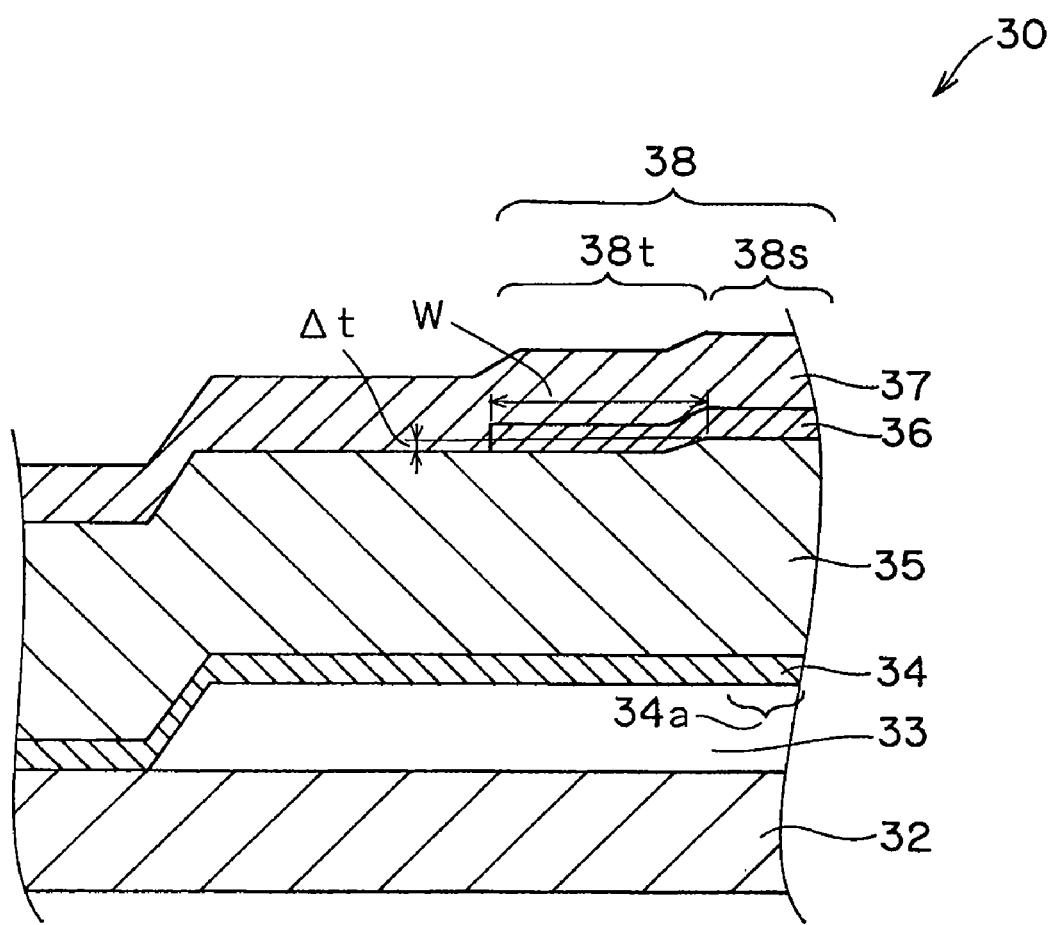
FIG. 13 is a fragmentary cross-sectional view of a piezoelectric resonator (Example 4).

A piezoelectric resonator according to a fourth embodiment will be described with reference to FIG. 13 that is a fragmentary cross-sectional view.

In a piezoelectric resonator 30, a vibrating region 38 is acoustically isolated from a substrate 32 with a gap 33, as in the first embodiment. Unlike the first embodiment, in a piezoelectric layer 35, a portion 34a constituting a central portion 38s of the vibrating region 38 has a thickness larger than that of the remainder. A bottom electrode 34, a top electrode 36, and a dielectric layer 37 each have a substantially constant thickness. Thus, a peripheral portion 38t of the vibrating region 38 has a thickness smaller than that of the central portion 38s, thereby forming a step in the vibrating region 38.

Specifically, for example, the dielectric layer 37 composed of $SiO_2$ is formed on the piezoelectric layer 35 composed of AlN. The width W of the step on the piezoelectric layer 35 is set at about 10 μm. A change in thickness $\Delta t$ is set at about 20 nm. The planar shape of the vibrating region 38 is a rectangle. Outer edges of the vibrating region 38 each have a waveform. A drawing is the same as FIG. 9(b) in the first embodiment and is thus omitted.

The piezoelectric resonator 30 can suppress both long-wavelength spurious modes and short-wavelength spurious modes as in the first embodiment.

FIFTH EMBODIMENT

A piezoelectric resonator 40 according to a fifth embodiment will be described with reference to FIG. 14 that is a fragmentary cross-sectional view.

Unlike the first embodiment, the piezoelectric resonator 40 does not include a dielectric layer. That is, a vibrating region 48 acoustically isolated from a substrate 42 with a gap 43 includes a bottom electrode 44, a piezoelectric layer 45, and a top electrode 46.

In the top electrode 46, a portion constituting a central portion 48s of the vibrating region 48 has a thickness larger than that of the remainder. The bottom electrode 44 and the piezoelectric layer 45 each have a substantially constant thickness. Thus, a peripheral portion 48t of the vibrating region 48 has a thickness smaller than that of the central portion 48s, thereby forming a step in the vibrating region 48.

Specifically, for example, the step is formed on the top electrode 46 disposed on the piezoelectric layer 45 composed of AlN. The width W of the step is set at about 10 μm. A change in thickness $\Delta t$ is set at about 5 nm. The planar shape of the vibrating region 48 is a rectangle. Outer edges of the vibrating region 48 each have a waveform. A drawing is the same as FIG. 9(b) in the first embodiment and is thus omitted.

The piezoelectric resonator 40 can suppress both long-wavelength spurious modes and short-wavelength spurious modes as in the first embodiment.

SIXTH EMBODIMENT

Figure 15:
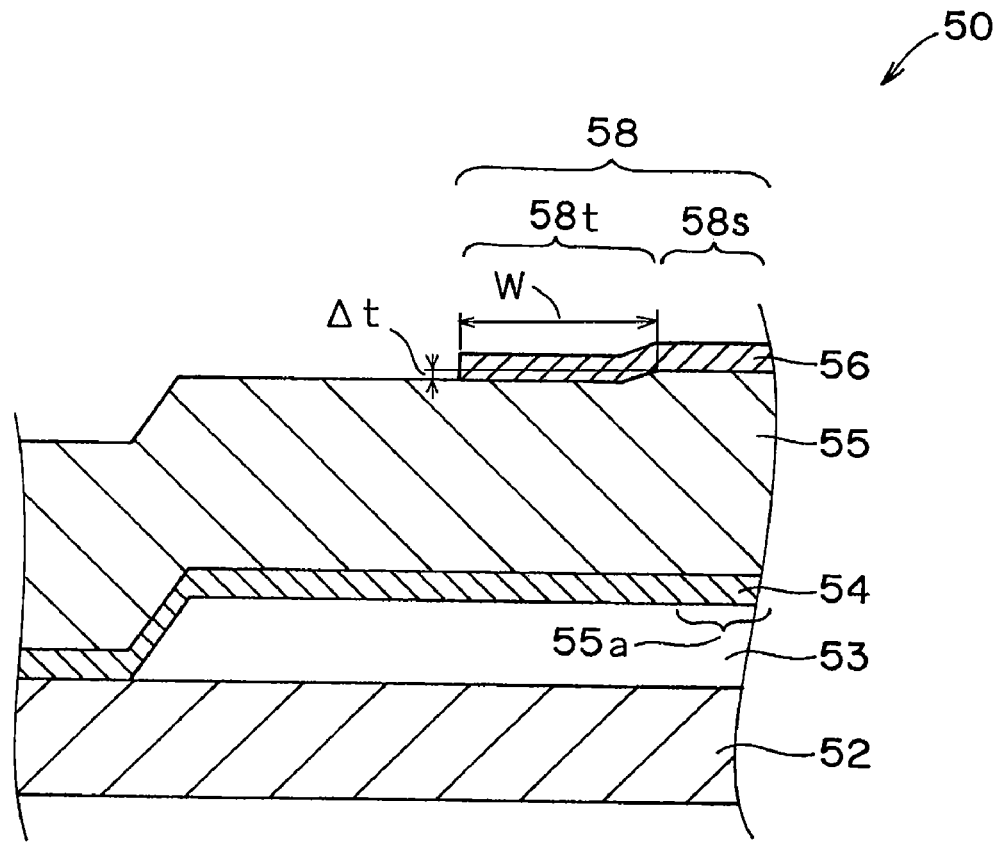
FIG. 15 is a fragmentary cross-sectional view of a piezoelectric resonator (Example 6).

A piezoelectric resonator 50 according to a sixth embodiment will be described with reference to FIG. 15 that is a fragmentary cross-sectional view.

Unlike the first embodiment, the piezoelectric resonator 50 does not include a dielectric layer. That is, a vibrating region 58 acoustically isolated from a substrate 52 with a gap 53 includes a bottom electrode 54, a piezoelectric layer 55, and a top electrode 56.

In the piezoelectric layer 55, a portion constituting a central portion 58s of the vibrating region 58 has larger than that of the remainder. The bottom electrode 54 and the top electrode 56 each have a substantially constant thickness. Thus, a peripheral portion 58t of the vibrating region 58 has a thickness smaller than that of the central portion 58s, thereby forming a step in the vibrating region 58.

Specifically, for example, the step is formed on the piezoelectric layer 45 composed of AlN. The width W of the step is set at about 10 μm. A change in thickness $\Delta t$ is set at about 20 nm. The planar shape of the vibrating region 58 is a rectangle. Outer edges of the vibrating region 58 each have a waveform. A drawing is the same as FIG. 9(b) in the first embodiment and is thus omitted.

The piezoelectric resonator 50 can suppress both long-wavelength spurious modes and short-wavelength spurious modes as in the first embodiment.

SEVENTH EMBODIMENT

Figure 16:
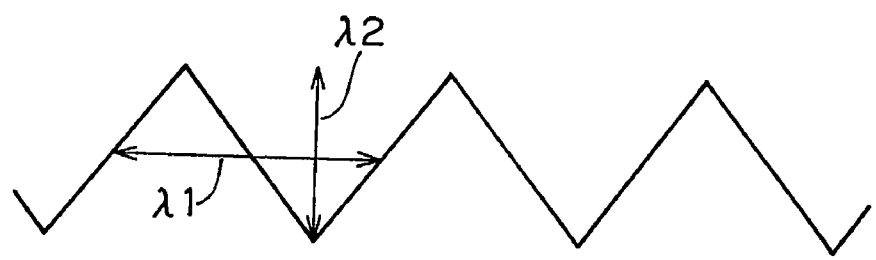
FIGS. 16(a) and 16(b) are each an enlarged fragmentary view of a piezoelectric resonator (Example 7).
Figure 16:
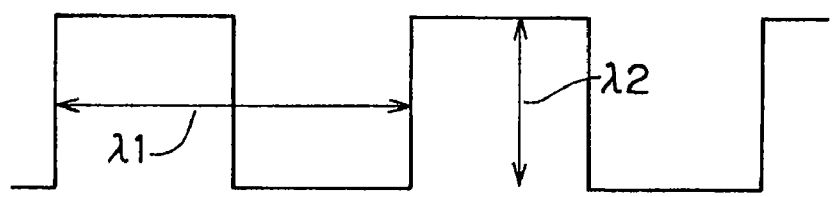

A piezoelectric resonator according to a seventh embodiment will be described with reference to FIG. 16 that is a partially enlarged view.

In the piezoelectric resonator, a vibrating region is acoustically isolated from a substrate with a gap, as in the first embodiment. Unlike the first embodiment, a bottom electrode, a piezoelectric layer, a top electrode, and a dielectric layer that constitute the vibrating region each have a substantially constant thickness.

The planar shape of outer edges of the vibrating region is a substantial rectangle as in the first embodiment. Sides of the substantially rectangular planar shape of the outer edges of the vibrating region each have a triangular waveform shown in FIG. 16(a) or a rectangular waveform shown in FIG. 16(b). As shown in FIGS. 16(a) and 16(b), let the length and total amplitude of the triangular or rectangular wave per period (wavelength) be λ1 and λ2, respectively. Characteristics of the resonator are changed depending on λ1 and λ2.

In the piezoelectric resonator according to the seventh embodiment, the outer edges of the vibrating region each have the waveform. They scatter waves comparable to the waveform of the outer edges of the vibrating region to eliminate spurious waves. The length of the waveform of the outer edges of the vibrating region may be ¼ or more times a wavelength to be suppressed. Each of λ1 and λ2 may be 0.5 or more times the thickness of the piezoelectric layer. Experiments demonstrated that each of λ1 and λ2 has an upper limit.

Figure 17:
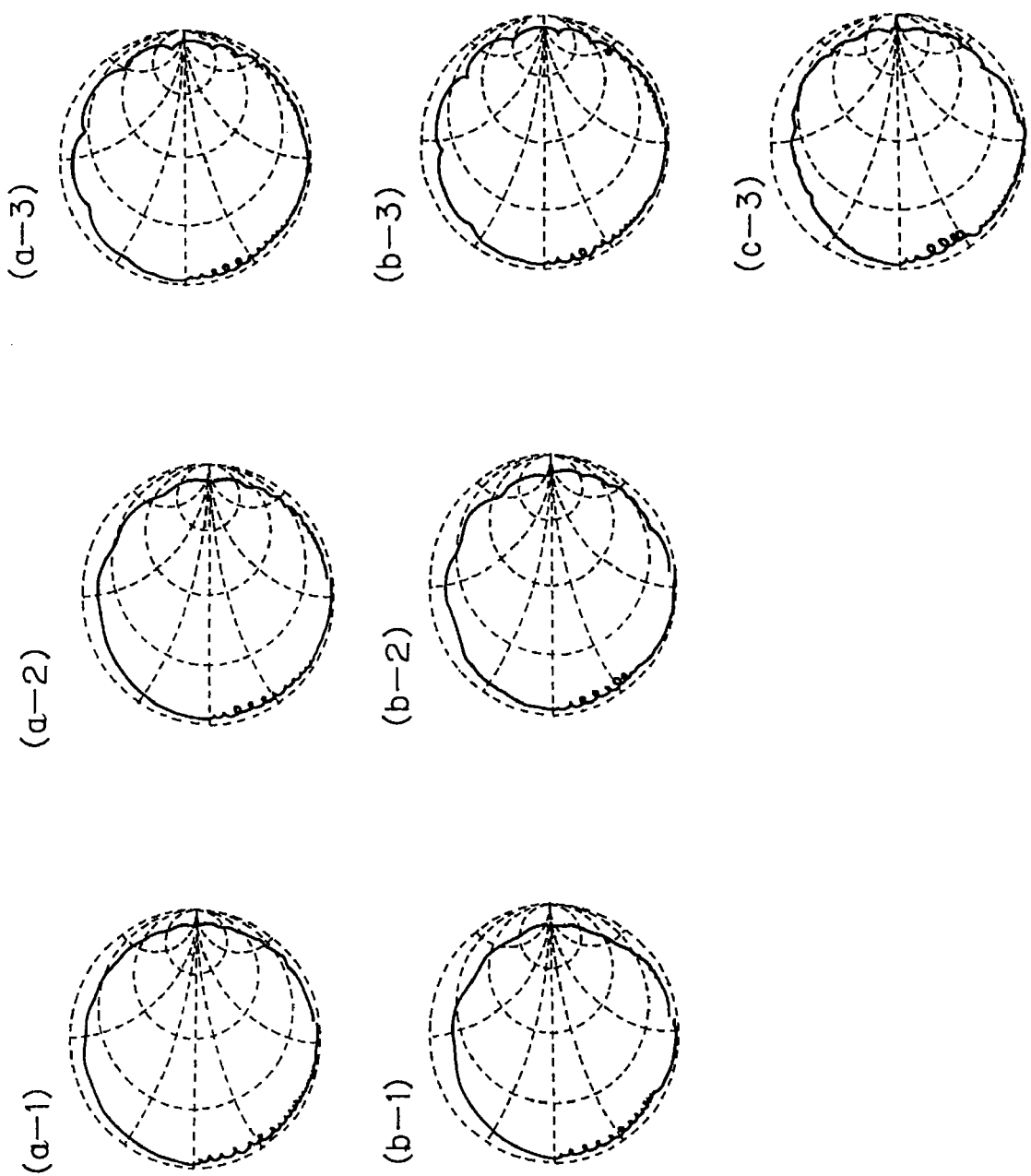
FIGS. 17(a-1) to 17(c-3) are each a Smith chart showing resonator characteristics (Example 7).
Figure 18:
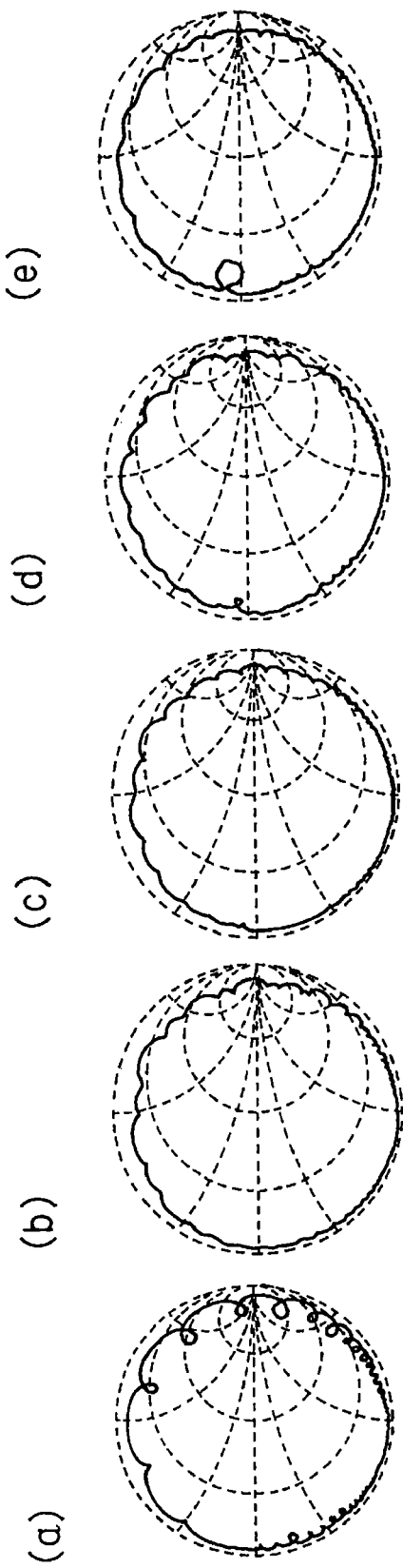
FIGS. 18(a) to 18(e) are each a Smith chart showing resonator characteristics (Example 8).
Figure 19:
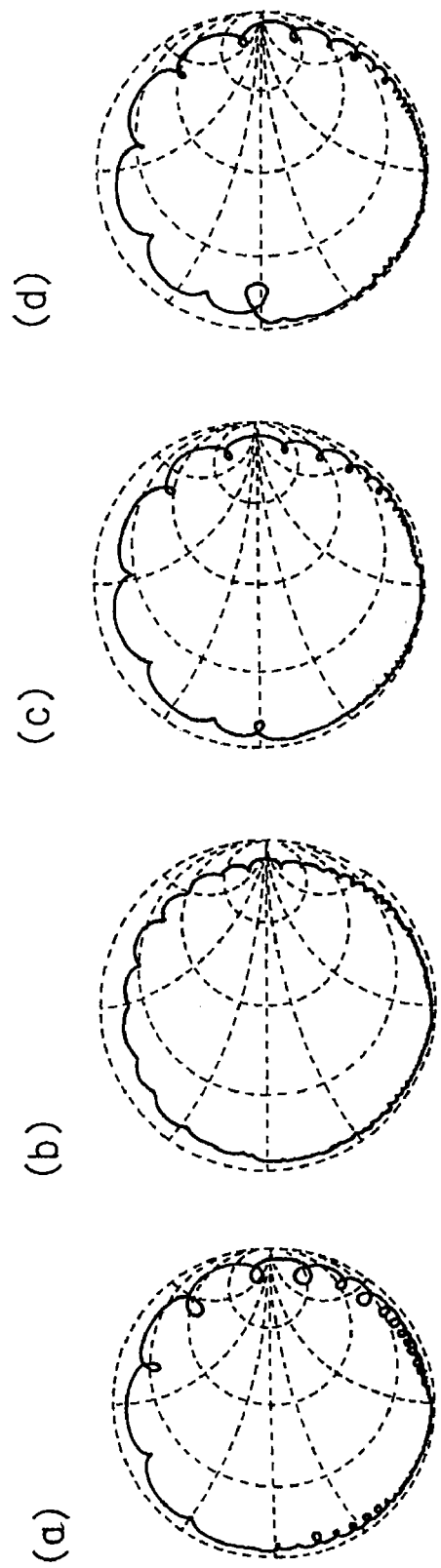
FIGS. 19(a) to 19(d) are each a Smith chart showing resonator characteristics (Example 9).
Figure 20:
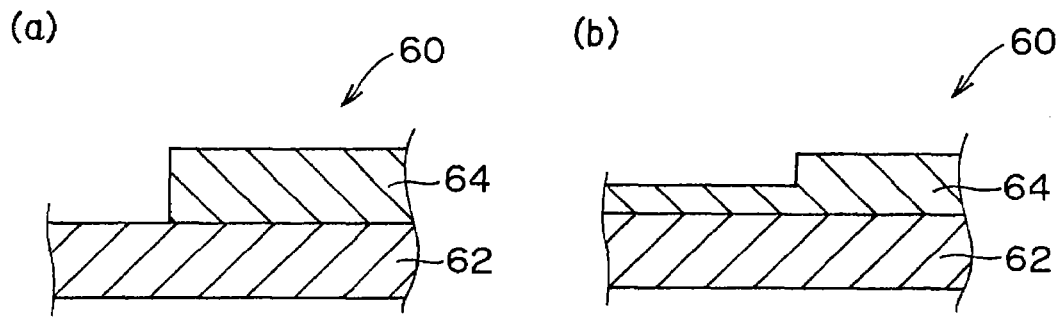
FIGS. 20(a) and 20(b) are each an explanatory drawing of a step of a top electrode (Example 10).
Figure 21:
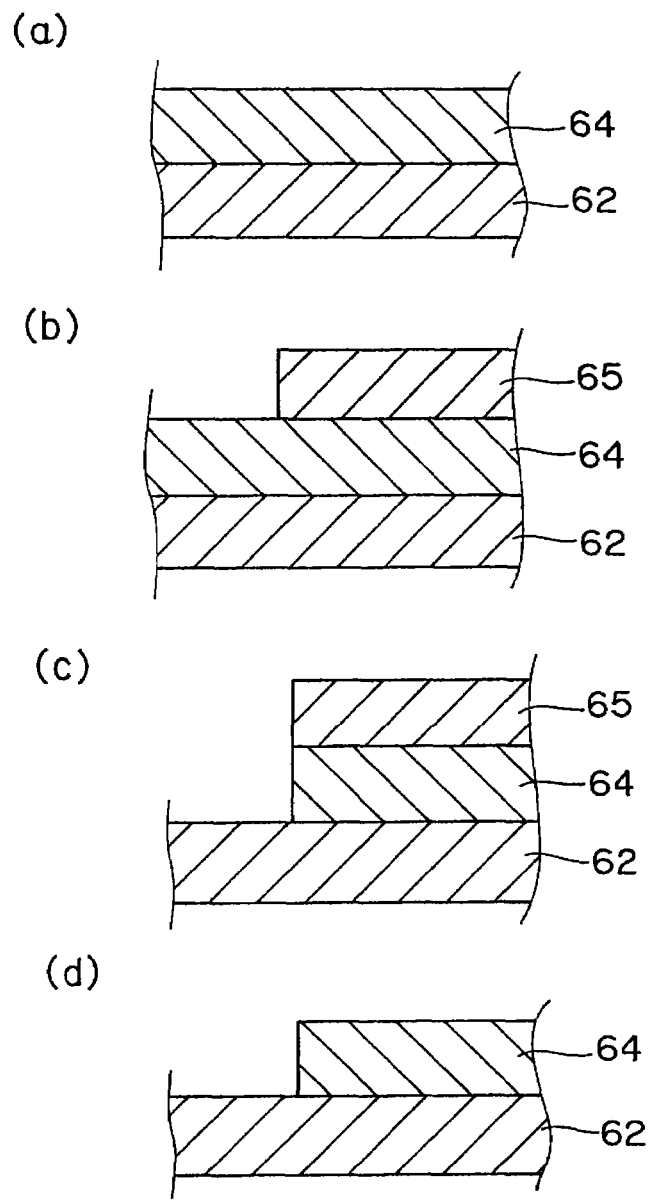
FIGS. 21(a) to 21(d) are each an explanatory drawing of a process of forming a step on the top electrode (Example 10).

FIGS. 17(a-1) to 17(c-3) are each a Smith chart showing characteristics (experimental values) of the piezoelectric resonator for use in 1.8-GHz band, the piezoelectric resonator including the piezoelectric layer having a thickness of 1.6 μm and not having a step in the vibrating region, when λ1 and λ2 of the triangular or rectangular wave of each side of the substantial rectangular planar shape of the outer edges of the vibrating region are changed in the ranges of λ1=10 to 30 (μm) and λ2=5 to 15 (μm). With respect to λ1, in FIGS. 17(a-1) and 17(b-1), λ1=10 (μm). In FIGS. 17(a-2) and (b-2), λ1=(20 μm). In FIGS. 17(a-3), 17(b-3), and 17(c-3), λ1=30 (μm). With respect to λ2, in FIGS. 17(a-1), 17(a-2), and 17(a-3), λ2=5 (μm). In FIGS. 17(b-1), 17(b-2), and 17(b-3), λ2=10 (μm). In FIG. 17(c-3), λ2=15 (μm).

FIGS. 17(a-1) to 17(c-3) show that when λ1≦20 μm and λ2≦10 μm, short-wavelength spurious modes are suppressed. The upper limit of λ1 is 12.5 times the piezoelectric layer (20/1.6=12.5). The upper limit of λ2 is 6.25 times the piezoelectric layer (10/1.6).

EIGHTH EMBODIMENT

In a piezoelectric resonator according to an eighth embodiment, the planar shape of a vibrating region is a rectangle. Outer edges of the vibrating region do not have a waveform. Sides of the rectangular planar shape are each straight. A step is formed on a dielectric layer as shown in FIG. 9(a).

FIGS. 18(a) to 18(e) are each a Smith chart showing characteristics of the piezoelectric resonator for use in 1.8-GHz band, the piezoelectric resonator including the dielectric layer having a thickness of 1.6 μm, when the width W of the step is changed in the range of W=0 to 20 (μm) while a change in the thickness Δt of the step formed on the dielectric layer composed of $SiO_2$ is a constant (20 nm). In FIG. 18(a), W=0 (μm), i.e., a step is absent on the vibrating region. In FIG. 18(b), W=5 (μm). In FIG. 18(c), W=10 (μm). In FIG. 18(d), W=15 (μm). In FIG. 18(e), W=20 (μm).

FIGS. 18(a) to 18(e) show that when the step width W is in the range of 5≦W<15, long-wavelength spurious modes are suppressed. The results demonstrate that the lower limit of the step width W is about three times the thickness of the piezoelectric layer. The upper limit of the step width W is about is about nine times the thickness of the piezoelectric layer.

NINTH EMBODIMENT

In a piezoelectric resonator according to a ninth embodiment, the planar shape of a vibrating region is a rectangle. Outer edges of the vibrating region do not have a waveform. Sides of the rectangular planar shape are each straight. A step is formed on a dielectric layer as shown in FIG. 9(a).

FIGS. 19(a) to 19(d) are each a Smith chart showing characteristics of the piezoelectric resonator for use in 1.8-GHz band, the piezoelectric resonator including the dielectric layer having a thickness of 1.6 μm, when a change in the thickness Δt of the step is changed in the range of Δt=0 to 40 (nm) while the width W of the step formed on the dielectric layer composed of $SiO_2$ is a constant (10 μm). In FIG. 19(a), Δt=0 (i.e., a step is absent). In FIG. 19(b), Δt=20 (nm). In FIG. 19(c), Δt=30 (nm). In FIG. 19(d), Δt=40 (nm).

FIGS. 19(a) to 19(d) show that when the change in the thickness Δt of the step is in the range of 0<Δt<30, long-wavelength spurious modes are suppressed.

TENTH EMBODIMENT

The formation of a step on a top electrode will be described with reference to FIGS. 20(a) to 21(d).

Figure 12:
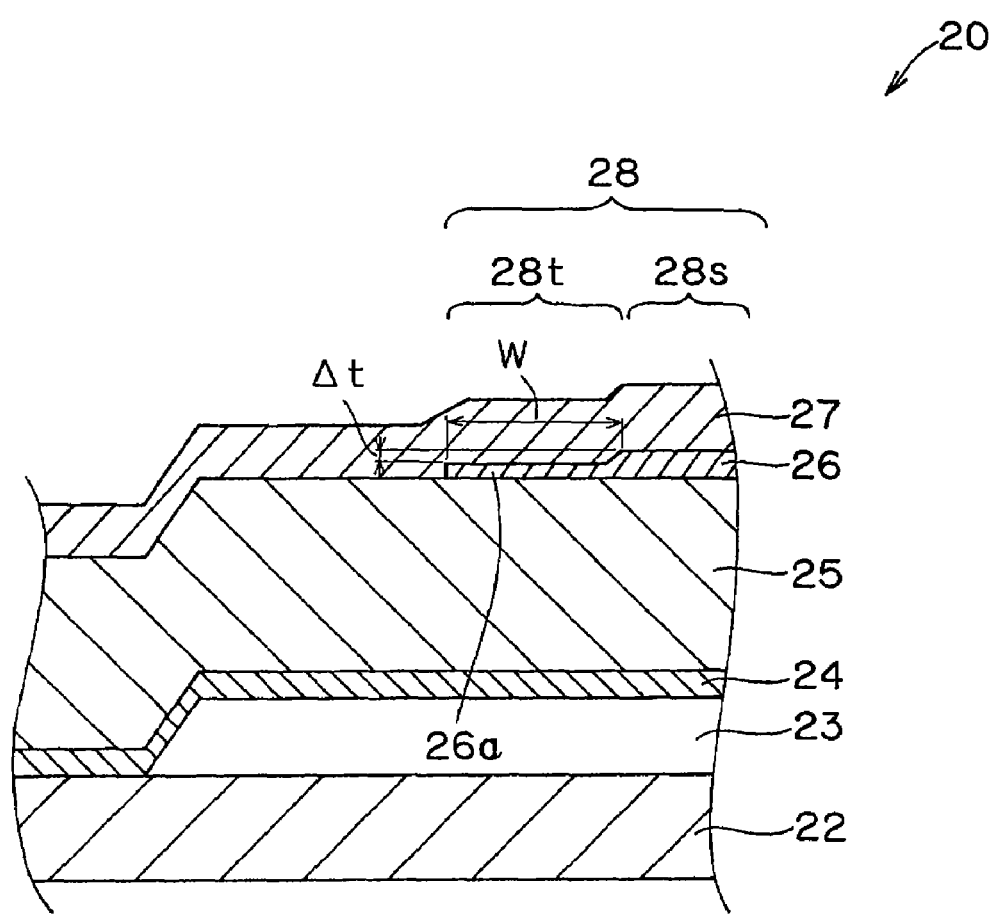
FIG. 12 is a fragmentary cross-sectional view of a piezoelectric resonator (Example 3).
Figure 14:
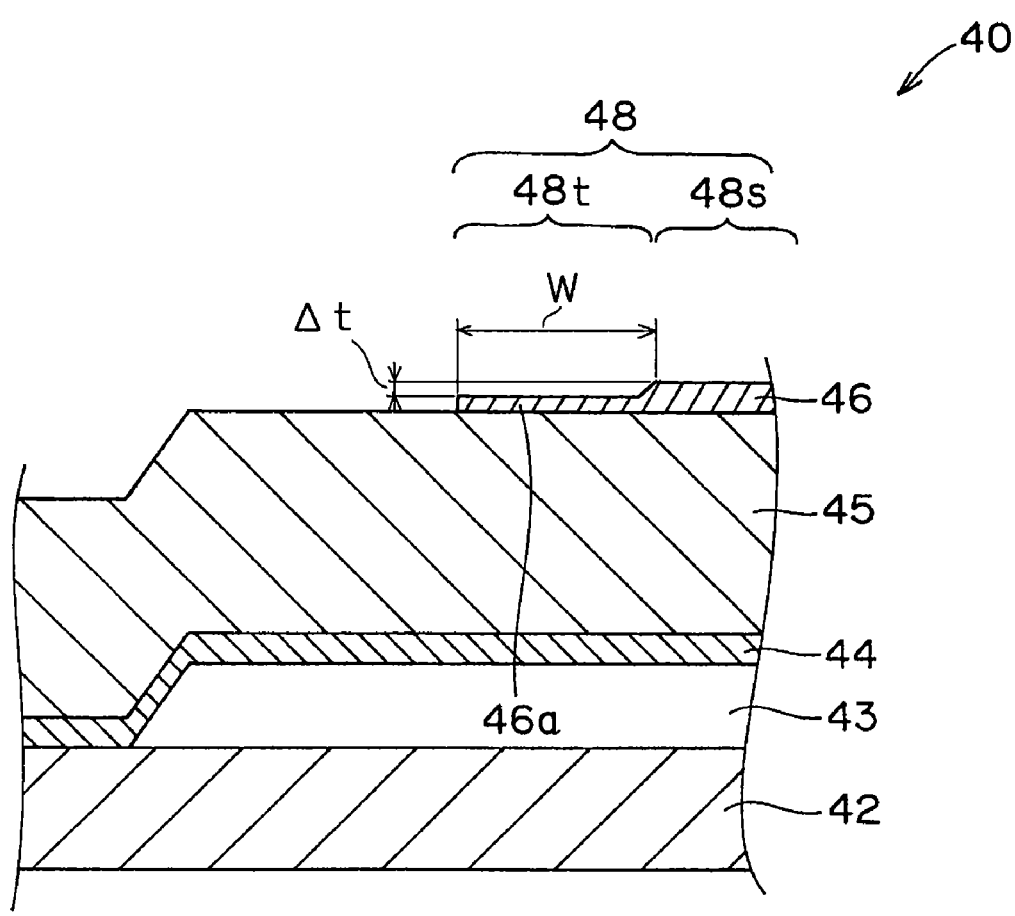
FIG. 14 is a fragmentary cross-sectional view of a piezoelectric resonator (Example 5).

As shown in FIGS. 12 and 14, in the case where steps are formed on the vibrating regions 28 and 48 by changing the thicknesses of the top electrodes 26 and 46, the steps are formed by etching.

As shown in FIGS. 20(a) and 20(b), a top electrode 60 includes at least one layer 64 having a low etching resistance, the at least one layer 64 being composed of Al, Au, or the like and located as the uppermost layer; and at least one layer 62 having a high etching resistance, the at least one layer 62 being composed of Pt or the like and located below the at least one layer 64.

When the formation of the step is stopped in the middle of the uppermost layer 64 as shown in FIG. 20(b), controllability is poor. When the layer 64 having a low etching resistance is completely removed by etching, etching is stopped at the layer 62 having a high etching resistance; hence, controllability is satisfactory.

The top electrode 60 having a step may be formed by a procedure shown in FIGS. 21(a) to 21(d).

As shown in FIG. 21(a), the layer 64 having a low etching resistance and composed of Al, Au, or the like is formed on the layer 62 having a high etching resistance and composed of Pt or the like. As shown in FIG. 21(b), an etching mask is formed with a resist 65. As shown in FIG. 21(c), for a portion to be formed into a step, the layer 64 having a low etching resistance is completely removed by etching with the mask. As shown in FIG. 21(d), the resist 65 is removed.

Examples of a material usable for the layer 62 having a relatively high etching resistance include metals, such as W, Mo, Ir, Os, Re, and Ru, as well as Pt. Examples of a material usable for the layer 64 having a relatively low etching resistance include metals, such as Ti, NiCr, Cr, and Cu, as well as Al and Au. Two or more metals may be used for each of the layers 62 and 64.

The use of the top electrode including the two layers having different etching resistances facilitates formation of the step on the vibrating region.

ELEVENTH EMBODIMENT

The profile of a vibrating region will be described with reference to FIGS. 22(a) and 22(b) that are each a fragmentary cross-sectional view.

As shown in FIG. 22(a), an inclined surface 66k is formed in the vicinity of the boundary 66b between a central portion 66s and a peripheral portion 66t of a vibrating region 66 to form a tapered profile with a gradual change in the thickness of the vibrating region 66. Thereby, a step is formed on the vibrating region 66.

Alternatively, as shown in FIG. 22(b) that is a fragmentary cross-sectional view, a substantially vertical surface 68k is formed in the vicinity of the boundary 68b between a central portion 68s and a peripheral portion 68t of a vibrating region

68 to form a step profile having a sharp change in the thickness of the vibrating region 68. Thereby, a step is formed on the vibrating region 68.

Figure 22:
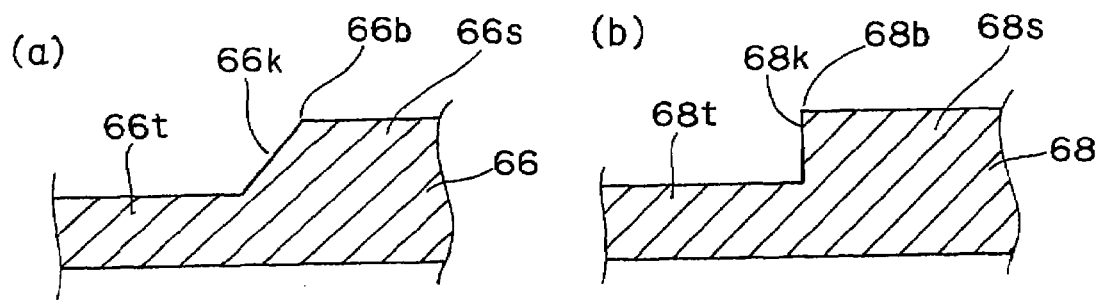
FIGS. 22(a) and 22(b) are each an explanatory drawing of a step of a vibrating region (Example 11).

It is difficult to obtain the substantially right-angled profile as shown in FIG. 22(*b*) by etching or a lift-off method. Such a tapered profile as shown in FIG. 22(*a*) is easily obtained to a varying degree. Calculation and actual measurement demonstrated that the tapered step shown in FIG. 22(*a*) also has a spurious-mode-suppressing effect comparable to the step shown in FIG. 22(*b*).

TWELFTH EMBODIMENT

A lattice filter 72 according to a twelfth embodiment will be described with reference to FIGS. 23 and 24.

Figure 23:
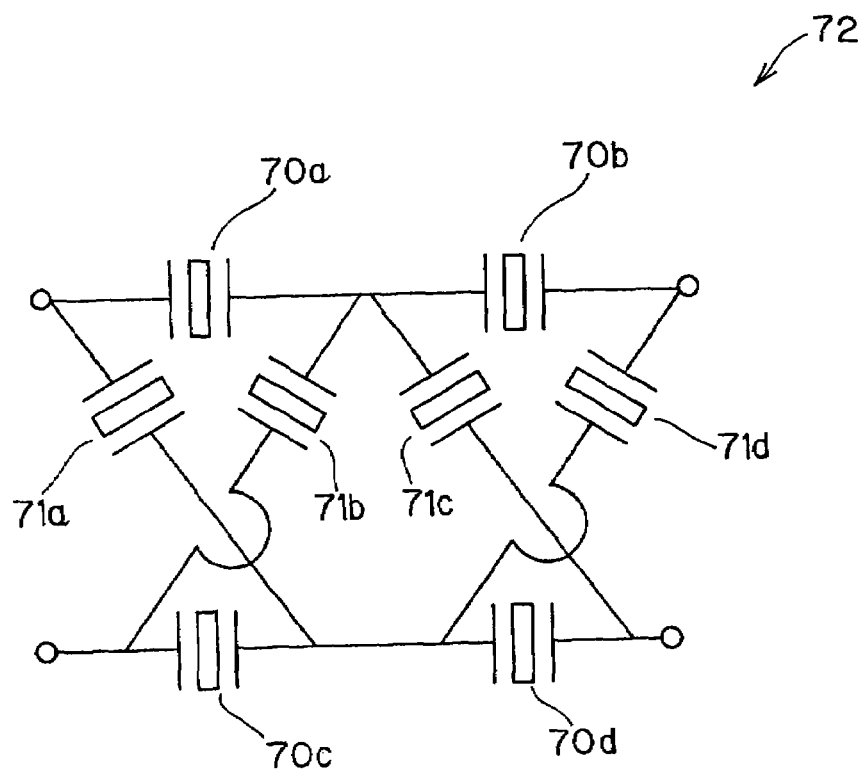
FIG. 23 is a block diagram of a lattice filter (Example 12).

As show in FIG. 23, a lattice filter 72 is configured by connecting series resonators 70*a* to 70*d* and parallel resonators 71*a* to 71*d* in the form of a lattice. FIG. 23 shows the case where the number of poles is two. The number of poles may be one or three or more.

In the lattice filter 72, only each of the series resonators 70*a* to 70*d* each having a relatively high frequency has a structure capable of suppressing long-wavelength spurious modes. That is, only each of the series resonators 70*a* to 70*d* each having a relatively high frequency has a step along outer edges of a vibrating region.

Figure 24:
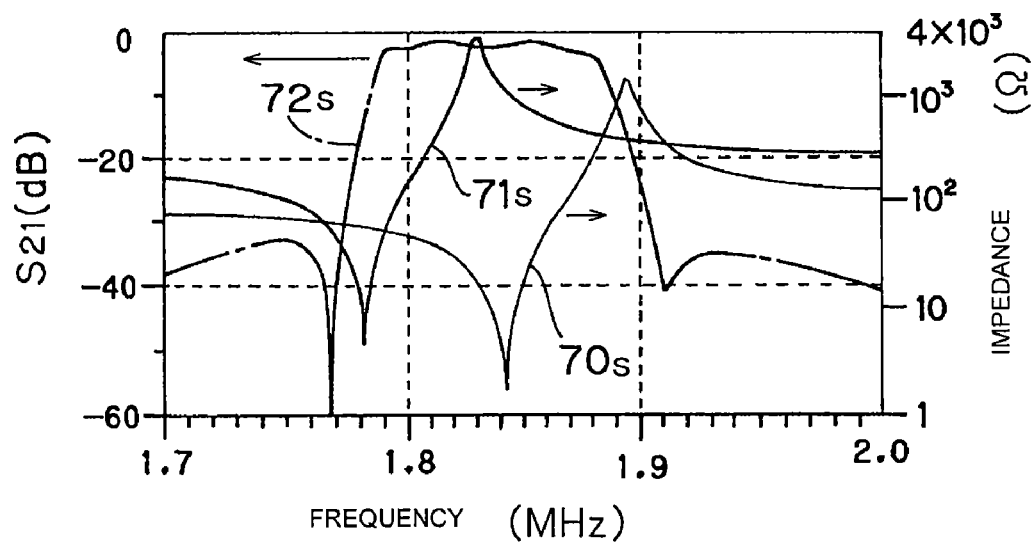
FIG. 24 is a graph showing characteristics of a lattice filter (Example 12).

FIG. 24 shows exemplary characteristics of the lattice filter 72. Reference numeral 70*s* represents impedance characteristics when the series resonators 70*a* to 70*d* have the same characteristic. Reference numeral 71*s* represents impedance characteristics when the parallel resonators 71*a* to 71*d* have the same characteristic. Reference numeral 72*s* represents filter characteristics of the lattice filter 72 including the series resonators 70*a* to 70*d* having the impedance characteristics represented by reference numeral 70*s* and the parallel resonators 71*a* to 71*d* having the impedance characteristics represented by reference numeral 71*s*.

The lattice filter 72 has satisfactory spurious characteristics with ripples suppressed in the pass band width of the filter.

THIRTEENTH EMBODIMENT

A ladder filter 76 according to a thirteenth embodiment will be described with reference to FIGS. 25 and 26.

Figure 25:
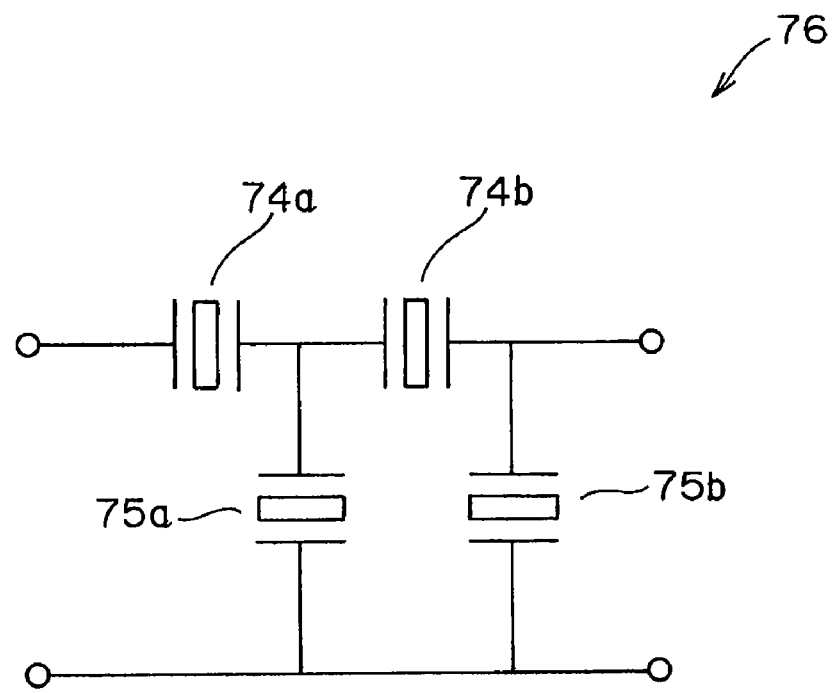
FIG. 25 is a block diagram of a ladder filter (Example 13).

As shown in FIG. 25, the ladder filter 76 is configured by connecting series resonators 74*a* and 74*b* and parallel resonators 75*a* and 75*b* in the form of a ladder. FIG. 25 shows the case where the number of poles is two. The number of poles may be one or three or more.

In the ladder filter 76, only each of the series resonators 74*a* to 74*b* has a structure capable of suppressing long-wavelength spurious modes. That is, only each of the series resonators 74*a* to 74*b* has a step along outer edges of a vibrating region, wherein a peripheral portion of the vibrating region has a thickness smaller than that of a central portion of the vibrating region.

Figure 26:
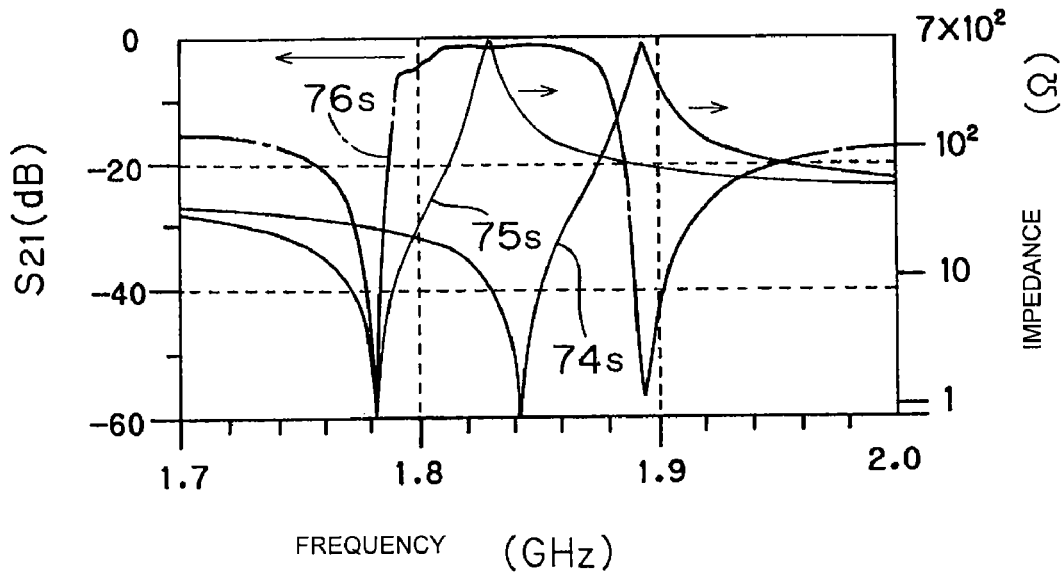
FIG. 26 is a graph showing characteristics of a ladder filter (Example 13).

FIG. 26 shows exemplary characteristics of the ladder filter 76. Reference numeral 74*s* represents impedance characteristics when the series resonators 74*a* and 74*b* have the same characteristic. Reference numeral 75*s* represents impedance characteristics when the parallel resonators 75*a* and 75*b* have the same characteristic. Reference numeral 76*s* represents filter characteristics of the ladder filter 76 including the series resonators 74*a* and 74*b* having the impedance characteristics represented by reference numeral 74*s* and the parallel resonators 75*a* and 75*b* having the impedance characteristics represented by reference numeral 75*s*.

The ladder filter 76 has satisfactory spurious characteristics with ripples suppressed in the pass band width of the filter.

FOURTEENTH EMBODIMENT

A piezoelectric resonator according to a fourteenth embodiment will be described with reference to FIG. 27 that is a fragmentary plan view.

Figure 27:
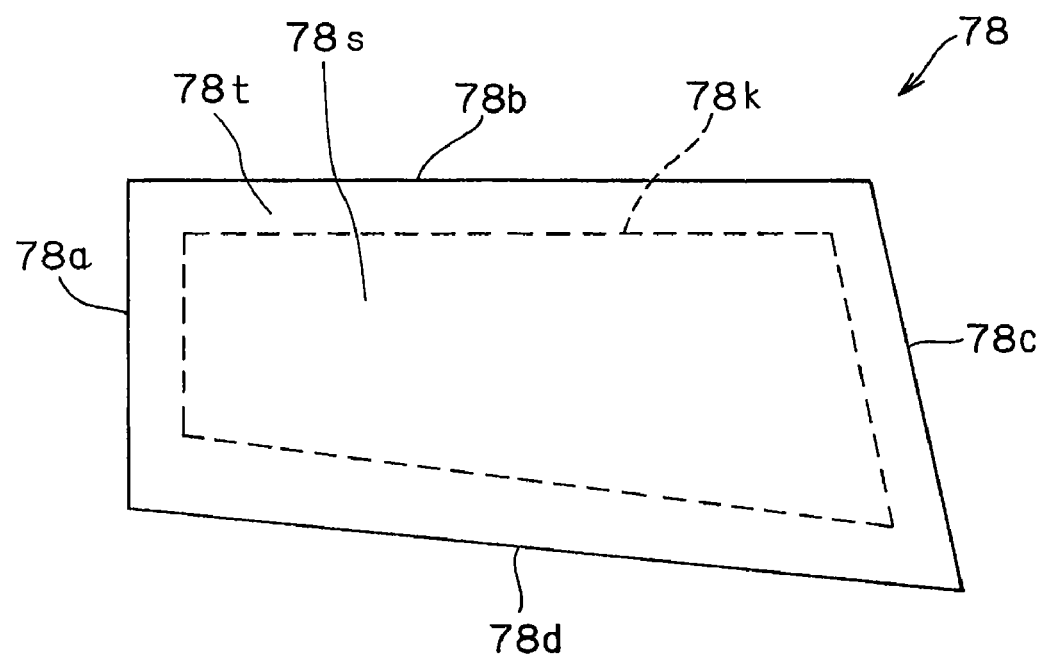
FIG. 27 is a fragmentary plan view of a piezoelectric resonator (Example 14).

As shown in FIG. 27, the planar shape of a vibrating region 78 of the piezoelectric resonator according to the fourteenth embodiment is a rectangle with sides that are not parallel to each other. Each of sides 78*a* to 78*d* of the rectangular planar shape of the vibrating region 78 does not have a waveform but is straight. The peripheral portion 78*t* of the vibrating region 78 has a thickness smaller than that of a central portion 78*s* of the vibrating region 78. The boundary 78*k* between the central portion 78*s* and the peripheral portion 78*t* of the vibrating region 78 is represented by a broken line.

The piezoelectric resonator according to the fourteenth embodiment reduces long-wavelength spurious modes. For example, a step is formed on the vibrating region 78 by changing a dielectric layer composed of $SiO_2$. The characteristics of the piezoelectric resonator in which the width of the step on the vibrating region 78 is 10 μm and in which a change in the thickness of the step is 20 nm are the same as that represented by Symbol s in FIGS. 5(*a*) and 5(*b*).

CONCLUSION

As described above, according to preferred embodiments of the present invention, there is provided a resonator having a shape that facilitates layout and having suppressed long-wavelength spurious modes and short-wavelength spurious modes. Furthermore, there is provided a filter having satisfactory ripple-suppressed filter characteristics while the pass band width of the filter is ensured.

The present invention is not limited to the above-described equivalents. Various modifications may be made.

For example, instead of the gap, the vibrating region may be acoustically isolated from the substrate by a sound reflecting layer disposed between the substrate and the vibrating region or an opening formed in the substrate. The piezoelectric layer may be composed of ZnO having type II dispersion characteristics. The dielectric layer may be composed of AlN, SiN, or the like in place of $SiO_2$. The step on the vibrating region may be formed by changing the thicknesses of two or more of the conductive layer, the piezoelectric layer, and the dielectric layer. The piezoelectric resonator may have a structure without the dielectric layer.

The invention claimed is:

1. A piezoelectric resonator comprising:
a substrate;
a pair of conductive layers disposed on the substrate; and
a piezoelectric layer disposed between the pair of conductive layers,
wherein the piezoelectric layer disposed between the pair of conductive layers is acoustically isolated from the substrate to form a vibrating region,
the vibrating region when viewed in a thickness direction of the pair of conductive layers and the piezoelectric layer has a substantial polygon shape, the sides of which are not parallel to each other, and
the vibrating region includes a peripheral portion extending along outer edges of the substantial polygon shape and a central portion inside the peripheral portion, the central portion having a larger thickness than the peripheral portion,
wherein the vibrating region is shaped so as to suppress a first spurious Lamb wave having a wavelength that is equal to or less than twice a thickness of the piezoelectric layer, and
the thicknesses of the peripheral portion and the central portion are configured to suppress a second spurious Lamb wave having a wavelength that is five or more times the thickness of the piezoelectric layer.

2. The piezoelectric resonator according to claim 1, further comprising a dielectric layer extending along at least one conductive layer of the pair of conductive layers, the dielectric layer being disposed on a side of the at least one conductive layer opposite the piezoelectric layer,
wherein the dielectric layer is arranged so as to be superposed at least on the vibrating region when viewed in the thickness direction of the pair of conductive layers and the piezoelectric layer.

3. The piezoelectric resonator according to claim 2, wherein the dielectric layer has a smaller thickness at a first portion included in the peripheral portion of the vibrating region than that of a second portion included in the central portion of the vibrating region.

4. The piezoelectric resonator according to claim 2, wherein the dielectric layer is composed of at least one dielectric material selected from the group consisting of $SiO_2$, AlN, and SiN.

5. The piezoelectric resonator according to claim 1, wherein each of the outer edges of the vibrating region has at least one waveform selected from a triangular wave, a rectangular wave, a sinusoidal wave, an irregular wave, and a combination thereof.

6. The piezoelectric resonator according to claim 1, wherein the vibrating region has a substantially rectangular planar shape, and each of the outer edges of the planar shape has a waveform in which a single wave segment having a length of 0.5 to 12.5 times the thickness of the piezoelectric layer is repeated.

7. The piezoelectric resonator according to claim 1, wherein the vibrating region has a substantially rectangular planar shape, and each of the outer edges of the planar shape has a waveform in which a single wave segment having a total amplitude of 0.5 to 6.25 times the thickness of the piezoelectric layer is repeated.

8. The piezoelectric resonator according to claim 1, wherein at least one of the pair of conductive layers has a smaller thickness at a first portion included in the peripheral portion of the vibrating region than that of a second portion included in the central portion of the vibrating region.

9. The piezoelectric resonator according to claim 1, wherein the piezoelectric layer has a smaller thickness at a first portion included in the peripheral portion of the vibrating region than that of a second portion included in the central portion of the vibrating region.

10. The piezoelectric resonator according to claim 1, wherein the vibrating region has a step profile having a sharp change in thickness at a boundary between the peripheral portion and the central portion of the vibrating region.

11. The piezoelectric resonator according to claim 1, wherein a width of the peripheral portion of the vibrating region is 3 to 9 times a thickness of the piezoelectric layer.

12. The piezoelectric resonator according claim 1, wherein at least one conductive layer of the pair of conductive layers includes at least two stacked sublayers, a first sublayer of the at least two sublayers is located adjacent to the piezoelectric layer, and a second sublayer of the at least two sublayers is located remote from the piezoelectric layer and is arranged inside and apart from an end of the first sublayer in the vibrating region.

13. resonator according to claim 12, wherein the at least two stacked sublayers each have different etching resistances.

14. The piezoelectric resonator according to claim 13, wherein the first sublayer contains at least one metal selected from the group consisting of Pt, W, Mo, U, Os, Re, and Ru, and
the second sublayer contains at least one metal selected from the group consisting of Al, Ti, Au, NiCr, Cr, and Cu.

15. The piezoelectric resonator according to claim 1, wherein the piezoelectric layer is AlN or ZnO.

16. A piezoelectric thin-film filter comprising:
a plurality of piezoelectric resonators, wherein only some of the plurality of piezoelectric resonators are the piezoelectric resonators according to claim 1.

17. The piezoelectric thin-film filter according to claim 16, wherein the plurality of piezoelectric resonators are connected in the form of a ladder.

18. A piezoelectric resonator comprising:
a substrate;
a pair of conductive layers disposed on the substrate; and
a piezoelectric layer disposed between the pair of conductive layers,
wherein the piezoelectric layer disposed between the pair of conductive layers is acoustically isolated from the substrate to form a vibrating region,
the vibrating region when viewed in a thickness direction of the pair of conductive layers and the piezoelectric layer has a substantial polygon shape, the sides of which are not parallel to each other, and
the vibrating region includes a peripheral portion extending along outer edges of the substantial polygon shape and a central portion inside the peripheral portion, the central portion having a larger thickness than the peripheral portion,
wherein the peripheral portion of the vibrating region has a tapered profile with a gradual change in thickness in the vicinity of a boundary between the peripheral portion and the central portion of the vibrating region.

* * * * *